（12） United States Patent
Tomishima et al.

(10) Patent No.: US 10,490,239 B2
(45) Date of Patent: Nov. 26, 2019

(54) PROGRAMMABLE DATA PATTERN FOR REPEATED WRITES TO MEMORY

(71) Applicant: Intel Corporation, Santa Clara, CA (US)

(72) Inventors: Shigeki Tomishima, Portland, OR (US); Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 346 days.

(21) Appl. No.: 15/391,684

(22) Filed: Dec. 27, 2016

(65) Prior Publication Data

US 2018/0181344 A1 Jun. 28, 2018

(51) Int. Cl.

| G06F 12/00 | (2006.01) |
| G11C 7/20 | (2006.01) |
| G06F 13/38 | (2006.01) |
| G11C 7/10 | (2006.01) |
| G06F 12/02 | (2006.01) |

(52) U.S. Cl.
CPC .......... *G11C 7/20* (2013.01); *G06F 12/0223* (2013.01); *G06F 13/38* (2013.01); *G11C 7/1015* (2013.01); *G06F 2212/1016* (2013.01)

(58) Field of Classification Search
None
See application file for complete search history.

(56) References Cited

U.S. PATENT DOCUMENTS

| 5,381,368 A | 1/1995 | Morgan et al. |
| 5,440,517 A | 8/1995 | Morgan et al. |
| 5,625,601 A | 4/1997 | Gillingham et al. |
| 5,854,771 A | 12/1998 | Mori |
| 5,886,944 A | 3/1999 | Ahn |
| 5,956,285 A | 9/1999 | Watanabe et al. |
| 6,130,852 A | 10/2000 | Ohtani et al. |
| 6,246,614 B1 | 6/2001 | Ooishi |
| 6,289,413 B1 | 9/2001 | Rogers et al. |
| 6,337,832 B1 | 1/2002 | Ooishi et al. |
| 6,449,204 B1 | 9/2002 | Arimoto et al. |
| 9,001,607 B2 | 4/2015 | Ong |
| 2001/0008498 A1 | 7/2001 | Ooishi |
| 2001/0040830 A1 | 11/2001 | Matsui et al. |
| 2002/0118882 A1 | 8/2002 | Tezuka |

(Continued)

FOREIGN PATENT DOCUMENTS

WO 2015148870 A1 10/2015

OTHER PUBLICATIONS

International Search Report and Written Opinion received for International Patent Application No. PCT/US2016/017226, dated Jun. 3, 2016, 12 pages.

(Continued)

*Primary Examiner* — Midys Rojas
(74) *Attorney, Agent, or Firm* — Compass IP Law, PC

(57) ABSTRACT

A programmable data pattern for repeated writes to memory can enable efficient writing of a data pattern to multiple memory locations without transmitting the data pattern for each write. In one embodiment, a memory device includes input/output (I/O) circuitry to receive a command, a register to store a value to indicate a source of a data pattern to write in response to receipt of the command, and access circuitry to, in response to receipt of the command, write the data pattern to memory based on the source indicated by the value in the register.

28 Claims, 15 Drawing Sheets

(56) References Cited

U.S. PATENT DOCUMENTS

| | | |
|---|---|---|
| 2005/0251713 A1 | 11/2005 | Lee |
| 2006/0233013 A1 | 10/2006 | Tu et al. |
| 2007/0011596 A1 | 1/2007 | Suh |
| 2007/0147160 A1 | 6/2007 | Hanzawa et al. |
| 2008/0192556 A1 | 8/2008 | Kim et al. |
| 2010/0037122 A1 | 2/2010 | Blackmon et al. |
| 2010/0091538 A1 | 4/2010 | Kim et al. |
| 2010/0149894 A1 | 6/2010 | Mochida et al. |
| 2010/0157693 A1 | 6/2010 | Iwai et al. |
| 2011/0007583 A1 | 1/2011 | Lee et al. |
| 2011/0013447 A1 | 1/2011 | Hanzawa et al. |
| 2011/0289270 A1 | 11/2011 | Bell et al. |
| 2012/0159077 A1 | 6/2012 | Steely et al. |
| 2013/0151776 A1 | 6/2013 | Edelhaeuser et al. |
| 2014/0032830 A1 | 1/2014 | Hampel et al. |
| 2014/0059285 A1 | 2/2014 | Kim et al. |
| 2014/0063977 A1 | 3/2014 | Park |
| 2014/0173234 A1 | 6/2014 | Jung et al. |
| 2014/0177347 A1 | 6/2014 | Chatterjee et al. |
| 2015/0012694 A1 | 1/2015 | Edelhaeuser |
| 2015/0187440 A1 | 7/2015 | Hollis |
| 2015/0286406 A1 | 10/2015 | Maghraoui et al. |
| 2015/0286408 A1 | 10/2015 | Hampel et al. |
| 2016/0284390 A1 | 9/2016 | Tomishima et al. |
| 2018/0033489 A1 | 2/2018 | Son et al. |

OTHER PUBLICATIONS

U.S. Appl. No. 15/277,159, filed Sep. 27, 2016, 31 pages.

U.S. Appl. No. 15/277,182, filed Sep. 27, 2016, 42 pages.

Vivek Seshadri, et al., "RowClone: Fast and Energy-Efficient In-DRAM Bulk Data Copy and Initialization" Micro-46 Proceeding of the 46th Institute of Electrical and Electronics Engineers Annual Association for Computing Machinery {ACM} IEEE/ACM International Symposium Microarchitecture, 13 pages {Published Dec. 7, 2013}.

International Search Report and Written Opinion for PCT Patent Application No. PCT/US2017/060448, dated Feb. 5, 2018, 14 pages.

Notice of Allowance for U.S Appl. No. 15/277,182, dated Jun. 16, 2017, 8 pages.

International Search Report and Written Opinion for PCT Patent Application No. PCT/US17/13655, dated Apr. 28, 2017, 10 pages.

International Search Report and Written Opinion for PCT Patent Application No. PCT/US17/13656, dated Apr. 21, 2017, 8 pages.

U.S. Appl. No. 15/277,159, dated Feb. 14, 2018, 31 pages.

PROGRAMMABLE DATA PATTERN FOR REPEATED WRITES TO MEMORY

FIELD

The descriptions are generally related to memory, and more particularly, to a programmable data pattern for repeated writes to memory without requiring transmission of the data pattern for each write.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2016, Intel Corporation, All Rights Reserved.

BACKGROUND

Memory resources are used to store information in electronic devices and other computing environments. Memory resources are typically accessed via commands transmitted by a memory controller. For example, a memory controller transmits read and write commands to a memory device over signal lines, including command signal lines for transmission of commands and data signal lines for transmission of data. The transmission of data over the data signal lines is often a bottleneck that limits system performance and can also consume a significant amount of power.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
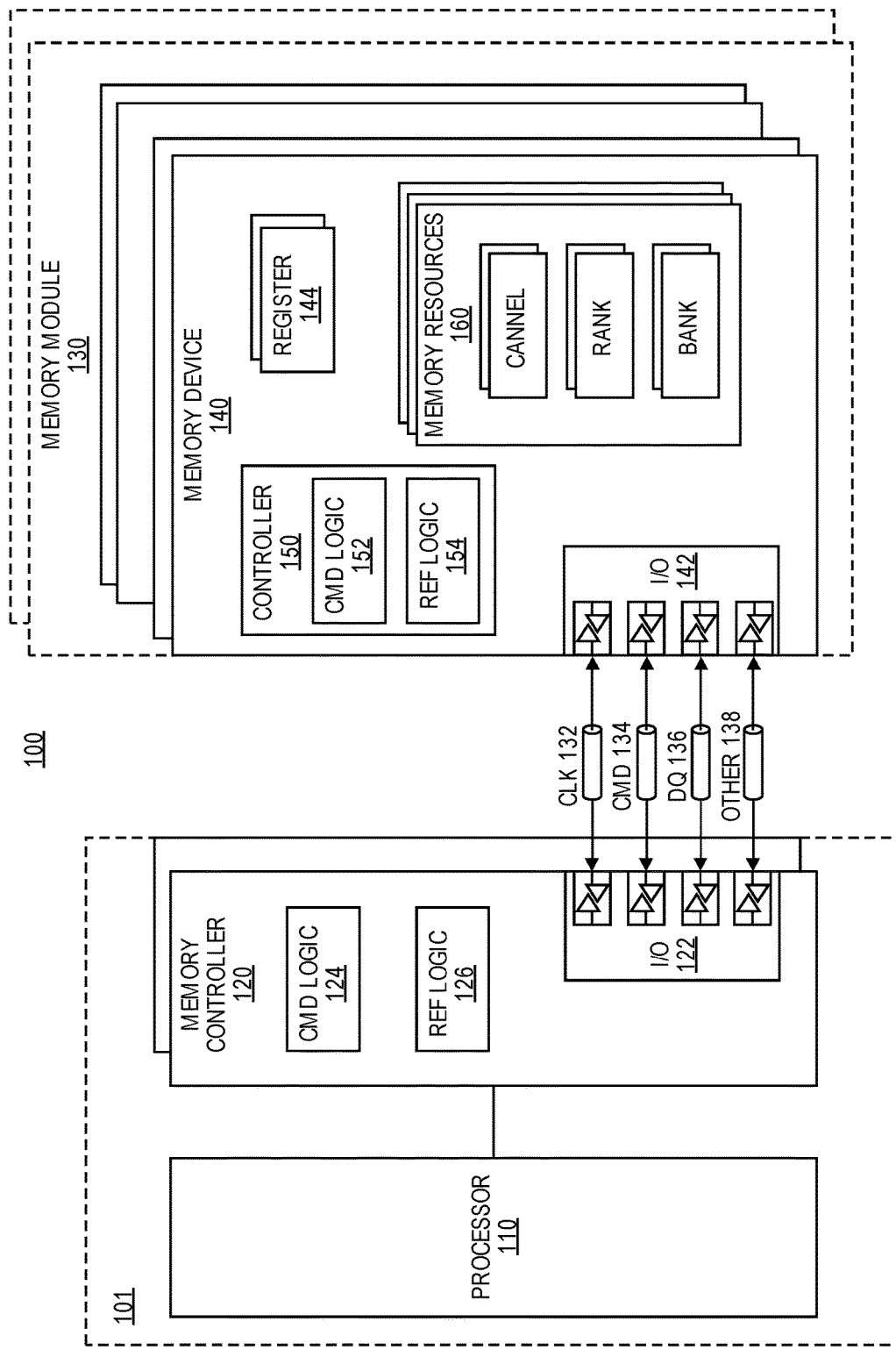
FIG. 1 is a block diagram of a system that can perform repeated writes of a programmable data pattern to memory, in accordance with an embodiment.

Descriptions of certain details and implementations follow, including a description of the figures, which may depict some or all of the embodiments described below, as well as discussing other potential embodiments or implementations of the inventive concepts presented herein.

DETAILED DESCRIPTION

Apparatuses, systems, and methods for a programmable data pattern for repeated writes to memory are described herein.

The operation of a computing system can sometimes involve the repeated writing of a pattern, such as all zeros, all ones, or another data pattern to memory. For example, the execution of some applications involves clearing blocks of memory (e.g., by writing zeros) at various times during execution. In one such example, some graphics intensive applications may involve writing zeros to blocks of memory to quickly change areas of a display to black. In another example, some systems may require fast writing of zeros for error correction coding (ECC) initialization or calibration. Repeatedly writing zeros using standard memory write commands can result in the same data pattern being repeatedly transmitted over the data bus, which is an inefficient use of system resources. In some cases, the number of memory cells to fill with zeros or another data pattern can be significant (e.g., an entire page or every memory cell on a memory chip), and the transmission of the data pattern for each write can be a significant source of power consumption.

There are some techniques to improve the efficiency of writing all zeros. For example, some computing systems implement a command specifically for writing zeros. However, there can be circumstances in which a computing system repeatedly writes a data pattern other than all zeros to memory. For example, an application may cause blocks of memory to be filled with ones to quickly change areas of a display to white. In another example, some computing systems include security features that modify (e.g., scramble) data before it is written to memory. In one such example, a processor could request that zeros be written to memory, but the memory controller can modify the data to be written to memory to a different pattern (e.g., a combination of zeros and ones) for security purposes. In one such example, the data stored in memory is a repetitive data pattern, but is not all zeros. Therefore, existing techniques that only address the efficient writing of all zeros could not be used to repeatedly write a different data pattern.

Unlike existing techniques that are limited to writing zeros, in one embodiment, a memory controller can cause all zeros, all ones, or another data pattern to be written to memory without repeatedly transmitting the data pattern over the data bus. According to embodiments, the memory controller can transmit a single command or multiple commands to cause a data pattern to be written repeatedly (e.g., the same data pattern is to be written to multiple memory locations). According to embodiments, regardless of whether the repeated writes are achieved with a single or multiple write commands, the data pattern to be written repeatedly is programmable rather than being limited to all zeros.

In one embodiment, the memory device includes a mode register that indicates the source of the data pattern to be written in response to a command. For example, in one embodiment, the mode register includes a field that can be programmed to indicate a source of a data pattern that is all zeros, a data source of a data pattern that is all ones, or data latches of the memory device that store a data pattern from a previous write command. In one such embodiment, the write circuitry of the memory device can include circuitry (e.g., a multiplexer or other selection circuitry) to select a data pattern source based on the value stored in the mode register.

According to embodiments, the mode register indicates what data pattern to write by indicating a source of the data pattern. For example, if the desired data pattern is all zeros, the source of the data pattern can be an input tied to a low voltage reference (e.g., ground) inside of the memory die. In another example, if the desired data pattern is all ones, the source of the data pattern can be an input tied to a high voltage reference (e.g., voltage source) inside of the memory die. In one embodiment, the data pattern is based on data latched in data latches from a prior memory write.

Therefore, unlike existing techniques that are limited to writing data patterns of all zeros, embodiments enable efficient writing of programmable data patterns to memory without requiring transmission of the data pattern for each write.

FIG. 1 is a block diagram of a system that can perform repeated writes of a programmable data pattern to memory without repeated transmission of the data pattern, in accordance with an embodiment. System 100 includes elements of a memory subsystem in a computing device. Processor 110 represents a processing unit of a host computing platform that executes an operating system (OS) and applications, which can collectively be referred to as a "host" for the memory. The OS and applications execute operations that result in memory accesses. Processor 110 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. System 100 can be implemented as an SOC (system on a chip), or be implemented with standalone components.

Memory controller 120 represents one or more memory controller circuits or devices for system 100. Memory controller 120 represents control logic that generates memory access commands in response to the execution of operations by processor 110. Memory controller 120 accesses one or more memory devices 140.

Reference to memory devices can apply to different memory types. In one embodiment, the memory device 140 includes a volatile memory device. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY, JESD235, originally published by JEDEC in October 2013), DDR5 (DDR version 5, currently in discussion by JEDEC), LPDDR5 (currently in discussion by JEDEC), HBM2 (HBM version 2, JESD235a, originally published by JEDEC in January 2016), HBM3 (HBM version 3, currently in discussion by JEDEC), or others or combinations of memory technologies, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory may be byte or block addressable. Block addressable or byte addressable nonvolatile memory may include, but are not limited to, 3-D cross-point memory, memory that use chalcogenide phase change material (e.g., chalcogenide glass), multi-threshold level NAND flash memory, NOR flash memory, single or multi-level phase change memory (PCM), resistive memory, nanowire memory, ferroelectric transistor random access memory (FeTRAM), magnetoresistive random access memory (MRAM) memory that incorporates memristor technology, or spin transfer torque MRAM (STT-MRAM), or a combination of any of the above, or other non-volatile memory types.

Descriptions herein referring to a "RAM" or "RAM device" can apply to any memory device that allows random access, whether volatile or nonvolatile. "DRAM" refers to dynamic RAM, and is volatile. The memory device or DRAM can refer to the die itself, to a packaged memory product that includes one or more dies, or both.

Memory devices 140 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. As used herein, coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one embodiment, settings for each channel are controlled by separate mode registers or other register settings. In one embodiment, each memory controller 120 manages a separate memory channel, although system 100 can be configured to have multiple channels managed by a single memory controller, or to have multiple memory controllers on a single channel. In one embodiment, memory controller 120 is part of host processor 110, such as logic implemented on the same die or implemented in the same package space as the processor (as shown by box 101).

Memory controller 120 includes input/output (I/O) interface logic 122 to couple to a system bus or a memory bus or both, such as a memory channel as referred to above. I/O interface logic 122 (as well as I/O interface logic 142 of memory device 140) can include pins, pads, connectors, signal lines, traces, or wires, or other hardware to connect the devices, or a combination of these. I/O interface logic 122 can include a hardware interface. As illustrated, I/O interface logic 122 includes at least drivers/transceivers for signal lines. Commonly, wires within an integrated circuit interface couple with a pad, pin, or connector to interface signal lines or traces or other wires between devices. I/O interface logic 122 can include drivers, receivers, transceivers, or termination, or other circuitry or combinations of circuitry to exchange signals on the signal lines between the devices. The exchange of signals includes at least one of transmit or receive. Although FIG. 1 illustrates the I/O interface logic 122 and 142 as including bidirectional connections, some embodiments include unidirectional connections. While shown as coupling I/O 122 from memory controller 120 to I/O 142 of memory device 140, it will be understood that in an implementation of system 100 where groups of memory devices 140 are accessed in parallel, multiple memory devices can include I/O interfaces to the same interface of memory controller 120. In an implementation of system 100 including one or more memory modules 130, I/O 142 can include interface hardware of the memory module in addition to interface hardware on the memory device itself. Other memory controllers 120 will include separate interfaces to other memory devices 140.

The system bus can be implemented as multiple signal lines coupling memory controller 120 to memory devices 140. The system bus includes at least clock (CLK) 132, command/address (CMD) 134, read DQ 136, and zero or more other signal lines 138. In one embodiment, a bus or connection between memory controller 120 and memory can be referred to as a memory bus. The signal lines for CMD can be referred to as a "C/A bus" (or ADD/CMD bus, or some other designation indicating the transfer of commands and address information) and the signal lines for write and read DQ can be referred to as a "data bus." In one embodiment, independent channels have different clock signals, C/A buses, data buses, and other signal lines. Thus, system 100 can be considered to have multiple "system buses," in the sense that an independent interface path can be considered a separate system bus. It will be understood that in addition to the lines explicitly shown, a system bus can include strobe signaling lines, alert lines, auxiliary lines, and other signal lines.

It will be understood that the system bus includes a command bus 134 configured to operate at a bandwidth. In one embodiment, the command and write signal lines can include unidirectional lines for write and command data from the host to memory, and read DQ 136 can include unidirectional lines for read data from the memory to the host. In one embodiment, the data bus can include bidirectional lines for read data and for write/command data. Based on design of system 100, or implementation if a design supports multiple implementations, the data bus can have more or less bandwidth per memory device 140. For example, the data bus can support memory devices that have either a x32 interface, a x16 interface, a x8 interface, or other interface. The convention "xW," where W is a binary integer refers to an interface size of memory device 140, which represents a number of signal lines to exchange data with memory controller 120. The interface size of the memory devices is a controlling factor on how many memory devices can be used concurrently per channel in system 100 or coupled in parallel to the same signal lines. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data.

Memory devices 140 represent memory resources for system 100. In one embodiment, each memory device 140 is a separate memory die. In one embodiment, each memory device 140 can interface with multiple (e.g., 2) channels per device or die. Each memory device 140 includes I/O interface logic 142, which has a bandwidth determined by the implementation of the device (e.g., x16 or x8 or some other interface bandwidth). I/O interface logic 142 enables the memory devices to interface with memory controller 120. I/O interface logic 142 can include a hardware interface, and can be in accordance with I/O 122 of memory controller, but at the memory device end. In one embodiment, multiple memory devices 140 are connected in parallel to the same data buses. For example, system 100 can be configured with multiple memory devices 140 coupled in parallel, with each memory device responding to a command, and accessing memory resources 160 internal to each. For a Write operation, an individual memory device 140 can write a portion of the overall data word, and for a Read operation, an individual memory device 140 can fetch a portion of the overall data word. As non-limiting examples, a specific memory device can provide or receive, respectively, 8 bits of a 128-bit data word for a Read or Write transaction, or 8 bits or 16 bits (depending for a x8 or a x16 device) of a 256-bit data word. The remaining bits of the word will be provided or received by other memory devices in parallel.

In one embodiment, memory devices 140 are disposed directly on a motherboard or host system platform (e.g., a PCB (printed circuit board) on which processor 110 is disposed) of a computing device. In one embodiment, memory devices 140 can be organized into memory modules 130. In one embodiment, memory modules 130 may represent dual inline memory modules (DIMMs). In one embodiment, memory modules 130 may represent other organization of multiple memory devices to share at least a portion of access or control circuitry, which can be a separate circuit, a separate device, or a separate board from the host system platform. Memory modules 130 can include multiple memory devices 140, and the memory modules can include support for multiple separate channels to the included memory devices disposed on them.

Memory devices 140 each include memory resources 160. Memory resources 160 represent individual arrays of memory locations or storage locations for data. Typically memory resources 160 are managed as rows of data, accessed via wordline (rows) and bitline (individual bits within a row) control. Memory resources 160 can be organized as separate channels, ranks, and banks of memory. Channels are independent control paths to storage locations within memory devices 140. Ranks refer to common locations across multiple memory devices (e.g., same row addresses within different devices). Banks refer to arrays of memory locations within a memory device 140. In one embodiment, banks of memory are divided into sub-banks with at least a portion of shared circuitry (e.g., drivers, signal lines, control logic) for the sub-banks. It will be understood that channels, ranks, banks, or other organizations of the memory locations, and combinations of the organizations, can overlap physical resources. For example, the same physical memory locations can be accessed over a specific channel as a specific bank, which can also belong to a rank. Thus, the organization of memory resources will be understood in an inclusive, rather than exclusive, manner.

In one embodiment, memory devices 140 include one or more registers 144. Register 144 represents one or more storage devices or storage locations that provide configuration or settings for the operation of the memory device. In one embodiment, register 144 can provide a storage location for memory device 140 to store data for access by memory controller 120 as part of a control or management operation. In one embodiment, register 144 includes one or more Mode Registers. In one embodiment, register 144 includes one or more multipurpose registers. The configuration of locations within register 144 can configure memory device 140 to operate in a different "mode," where command information can trigger different operations within memory device 140 based on the mode. Additionally or in the alternative, different modes can also trigger different operation from address information or other signal lines depending on the mode. Settings of register 144 can indicate configuration for I/O settings (e.g., to indicate a data pattern or source of data for writing a data pattern to memory), timing, termination or ODT (on-die termination), driver configuration, or other I/O settings).

Memory device 140 includes controller 150, which represents control logic within the memory device to control internal operations within the memory device. For example, controller 150 decodes commands sent by memory controller 120 and generates internal operations to execute or satisfy the commands. Controller 150 can be referred to as an internal controller. Controller 150 can determine what mode is selected based on register 144, and configure the internal execution of operations for access to memory resources 160 or other operations based on the selected mode. Controller 150 generates control signals to control the routing of bits within memory device 140 to provide a proper interface for the selected mode and direct a command to the proper memory locations or addresses.

Referring again to memory controller 120, memory controller 120 includes command (CMD) logic 124, which represents logic or circuitry to generate commands to send to memory devices 140. Typically, the signaling in memory subsystems includes address information within or accompanying the command to indicate or select one or more memory locations where the memory devices should execute the command. In one embodiment, controller 150 of memory device 140 includes command logic 152 to receive and decode command and address information received via I/O 142 from memory controller 120. Based on the received command and address information, controller 150 can control the timing of operations of the logic and circuitry within memory device 140 to execute the commands. Controller 150 is responsible for compliance with standards or specifications within memory device 140, such as timing and signaling requirements. Memory controller 120 can also ensure compliance with standards or specifications by access scheduling and control.

In one embodiment, memory controller 120 includes refresh (REF) logic 126. Refresh logic 126 can be used where memory devices 140 are volatile and need to be refreshed to maintain a deterministic state. In one embodiment, refresh logic 126 indicates a location for refresh, and a type of refresh to perform. Refresh logic 126 can trigger self-refresh within memory device 140, and issue external refreshes by sending refresh commands to trigger the execution of a refresh operation. For example, in one embodiment, system 100 supports all bank refreshes as well as per bank refreshes, or other all bank and per bank commands. All bank commands cause an operation of a selected bank within all memory devices 140 coupled in parallel. Per bank commands cause the operation of a specified bank within a specified memory device 140. In one embodiment, controller 150 within memory device 140 includes refresh logic 154 to apply refresh within memory device 140. In one embodiment, refresh logic 154 generates internal operations to perform refresh in accordance with an external refresh received from memory controller 120. Refresh logic 154 can determine if a refresh is directed to memory device 140, and what memory resources 160 to refresh in response to the command. For self-refresh, refresh logic 154 controls the timing and execution of refresh in response to entry into a low power mode and self-refresh based on a command from memory controller.

As mentioned above, in one embodiment, the memory controller 120 can transmit a command to the memory device 140 to cause a data pattern to be written to memory without transmitting the data pattern for each write. For example, command logic 124 of the memory controller 120 can generate such a command and I/O circuitry 122 can transmit the command over the C/A bus 134 to the memory device 140. In one embodiment, the command can be a modified write command that causes the memory device 140 to write a data pattern to memory in response to the command. The term "write-force" or "force-write" (WRITE-F) is used herein to refer to a command to cause the memory device 140 to write a programmable data pattern in response to the command without requiring transmission of data for each write. However, such a command can have a different name (e.g., WRITE-X or WRITEX or another name), or can be a sequence of commands that causes the data pattern to be written.

In one embodiment, the WRITE-F command can be a single command that spawns multiple internal writes in a memory device. In one such embodiment, the memory controller transmits the WRITE-F command once to cause a data pattern to be written to multiple memory locations without transmitting the pattern or command for each write over a data bus. In another embodiment, the memory controller transmits the WRITE-F command for each write, but does not transmit the data pattern for each write. Regardless of how many internal writes are triggered by a single WRITE-F command, the WRITE-F command can cause a data pattern to be written to memory without transmission of the data pattern over a data bus each time the data pattern is written, in accordance with embodiments. Thus, according to embodiments, the command logic includes circuitry to generate a WRITE-F command or a comparable command or sequence of commands.

The memory device 140 includes I/O circuitry 142 to receive the WRITE-F command. The internal controller 150 of the memory device 140 includes command logic 152 to decode the WRITE-F command. The memory device also includes a register (e.g., register 144) to store a value that indicates what data pattern to write in response to receipt of the WRITE-F command. In one embodiment, the register includes a "data status" field, although in other embodiments the name of the register field or fields can be different. Data status refers to whether write data comes from the external data lines or another source. The data status field can be set to indicate one of multiple "modes," including one or more of: an "all zeros" mode, an "all ones" mode, an "external or latched data" mode, or another data pattern mode, in accordance with embodiments. According to an embodiment, the data status field indicates one of multiple sources of a data pattern. For example, if the desired data pattern is all zeros, the data status field can indicate that the source of the data pattern is an input tied to ground. In another example, if the desired data pattern is all ones, the data status field can indicate that the source of the data pattern is an input tied to a voltage source. In one embodiment, the data status field can indicate that the source is a data latch of the memory device that stores a data pattern from a prior memory write.

The controller 150 of the memory device 140 can then write the data pattern that is indicated by the mode register to memory. For example, if the mode register indicates a source of "all zeros," the controller 150 write all zeros to memory. If the mode register indicates a source of "all ones," the controller 150 writes all ones to memory.

In one embodiment, if the mode register indicates that the data pattern source is external data, then the controller 150 writes the latched data pattern stored in data latches from a previous write command. In one such example, the memory controller 120 transmits a first write command to the memory device with the desired write pattern, causing the data pattern to be latched in data latches of the memory device. The memory controller 120 then transmits a second command (such as the WRITE-F command), which causes the memory device 140 to write the latched data to memory without receiving the data pattern over the signal lines for a data bus again.

According to embodiments, the memory device can perform a single write or multiple writes in response to a WRITE-F command. For example, in one embodiment, the memory device performs one write in response to receipt of the WRITE-F command; therefore, in one such embodiment, the memory controller transmits multiple WRITE-F commands to the memory device in order to write the data pattern to multiple memory locations. In another embodiment, the memory device performs multiple write operations in response to receiving a single WRITE-F command. In one such embodiments, the memory device can determine how many writes to perform in a variety of ways, such as a mode register setting, command encoding, or another way. Thus, by using a WRITE-F command and a mode register to indicate the source of the data pattern to write in response to receipt of the WRITE-F command, the memory controller can write the data pattern to memory without transferring the data pattern multiple times over the data bus. Unlike existing solutions that address repeatedly writing zeros, embodiments can enable efficient writing of a programmable data pattern that can be a pattern other than all zeros.

Figure 2:
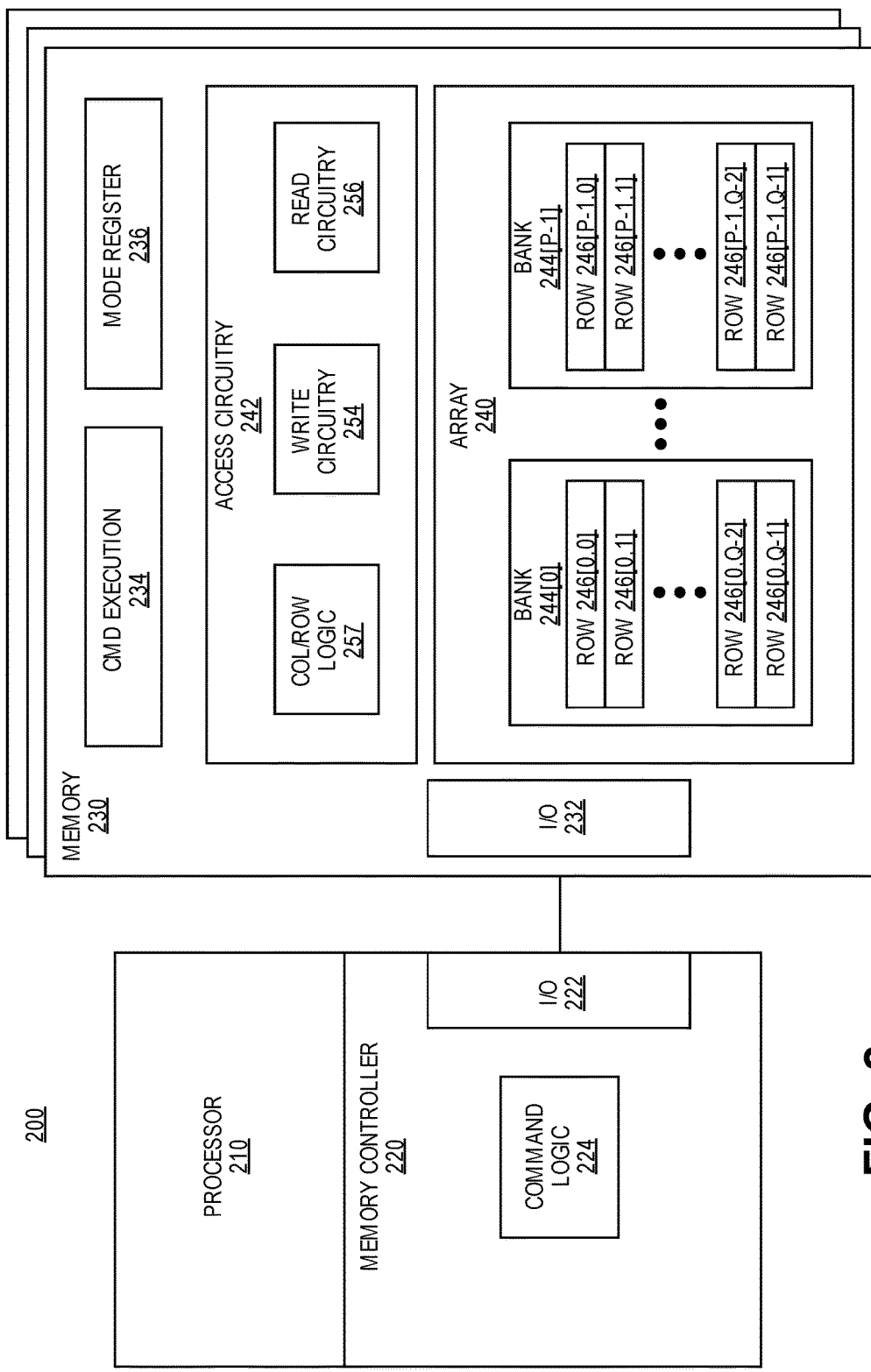
FIG. 2 is a block diagram of a system that can perform repeated writes of a programmable data pattern to memory, in accordance with an embodiment.

FIG. 2 is a block diagram of a system that can perform repeated writes of a programmable data pattern to memory, in accordance with an embodiment. System 200 illustrates one example of a system in accordance with system 100 of FIG. 1. System 200 includes processor 210, which can be or include one or multiple processors whose execution generates requests for data or code or both stored in memory 230. Memory 230 represents memory resources, such as the memory resources described above with respect to FIG. 1. Memory controller 220 generates memory access commands for specific addresses or storage location of memory 230 in response to memory requests created by execution of processor 210. Memory controller 220 includes mapping information to map data address information in processor 210 with physical locations in memory 230. In one embodiment, memory controller 220 is an integrated memory controller (e.g., iMC). In one embodiment, memory controller 220 is a standalone controller device or standalone circuit. In one embodiment, processor 210 and memory controller 220 are part of a common SOC.

Memory controller 220 includes I/O 222, which represents interface hardware and logic, such as what is described above with respect to I/O 122 of system 100. I/O 232 of memory 230 has corresponding signal lines to exchange data and commands with memory controller 220. Command logic 224 represents logic to enable memory controller 220 to issue commands to memory 230. The commands can include commands to set a mode of memory 230. The commands can include commands to access one or more memory locations of memory 230. For example, the command logic 224 can include logic to generate a WRITE-F command to cause the memory device to write a data pattern to memory. In one embodiment, memory 230 includes multiple separate memory devices, and I/O 222 can interface the multiple devices in parallel. Memory 230 includes memory array 240, which represents hardware storage locations.

Memory 230 includes command execution logic 234, which represents logic that enables memory 230 to decode commands within the memory device. For example, the command execution logic 234 includes logic to decode a WRITE-F command sent from the memory controller 220. Based on decoding the command, command execution logic 234 can generate one or more internal commands to perform the operations required by the commands. The internal commands can include setting logic values of switches, gates, or other hardware resources, or a combination, to perform the desired operations. Memory 230 includes access circuitry 242, which represents circuitry for accessing the memory array 240. In one embodiment, access circuitry 242 includes column and row logic 257 to select specific columns and rows of the memory array 240. Column and row logic 257 can include circuitry such as decoders, buffers, counters, and drivers to enable the selection of specific bits of specific rows 246 of one or more banks 244 of the memory array 240. Column logic can issue column address strobes (CAS) and row logic can issue row address strobes (RAS) in response to address decoding of address information in a received command. In one embodiment, column and row logic includes multiplexers, logic gates, or other circuitry, or a combination of circuits, to decode the address information.

The access circuitry 242 also includes write circuitry 254 and read circuitry 256. The write circuitry 254 includes circuitry to enable writing data to the memory cells of the array 240, and read circuitry 256 includes circuitry to enable reading the data stored in the memory cells of the memory array 240. The write circuitry 254 can include, for example, write drivers to interface with sense amplifiers of the memory array 240 to drive data into the memory cells. The read circuitry 256 can include one or more read drivers to interface with the sense amplifiers of the memory array 240 to read the stored data. In one embodiment, the access circuitry 242 includes a read and write driver for each bank. Although access circuitry 242 is illustrated as being external to the memory array 240, in some embodiments the memory array 240 includes the access circuitry 242. For example, in some embodiments, access circuitry is included in each bank 244.

In one embodiment, memory 230 includes mode register 236 or equivalent to store configuration information that at least partially controls the operation of memory 230. Settings within mode register 236 control the mode or state of operation of memory 230, and can control how received commands are decoded for execution by memory 230. In one embodiment, mode register 236 includes one or more bits to control data status, as described above with respect to FIG. 1.

Figure 5:
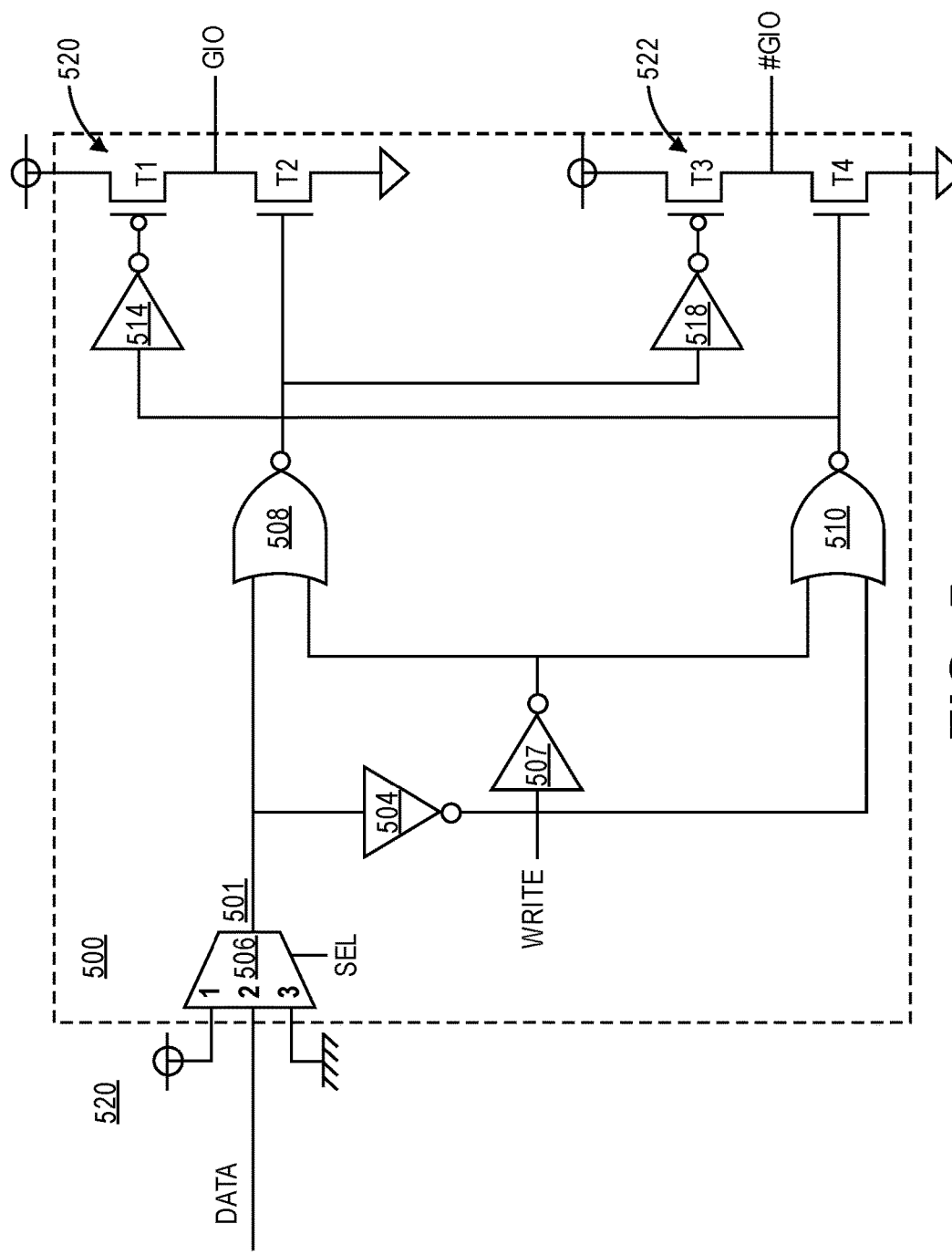
FIG. 5 is a circuit logic diagram of a write driver of a memory device to enable repeated writes of a programmable data pattern to memory, in accordance with an embodiment.

In one embodiment, the write circuitry 254 includes circuitry to enable performance of a WRITE-F command to write a data pattern. According to one embodiment, the write circuitry 254 writes a data pattern from one of multiple sources to memory depending on a mode register setting. For example, in one embodiment, the write circuitry 254 includes multiplexers (such as illustrated in FIG. 5, described below) to select one of multiple data sources based on a value stored in the mode register 236. For example, the inputs of a multiplexer in a write driver circuit can include data signal lines from data latches, ground, a voltage source, or another data pattern source. Depending on the value in the mode register, the access circuitry 242 will cause one of the multiple data patterns to be written to the memory cells in the memory array 240 in response to the command. Accordingly, in one embodiment, the memory controller 220 does not need to transmit the data pattern for each write associated with the WRITE-F command. By avoiding the transmission of data for each write, embodiments can enable more efficient writes of a programmable data pattern that is being written multiple times.

Figure 3:
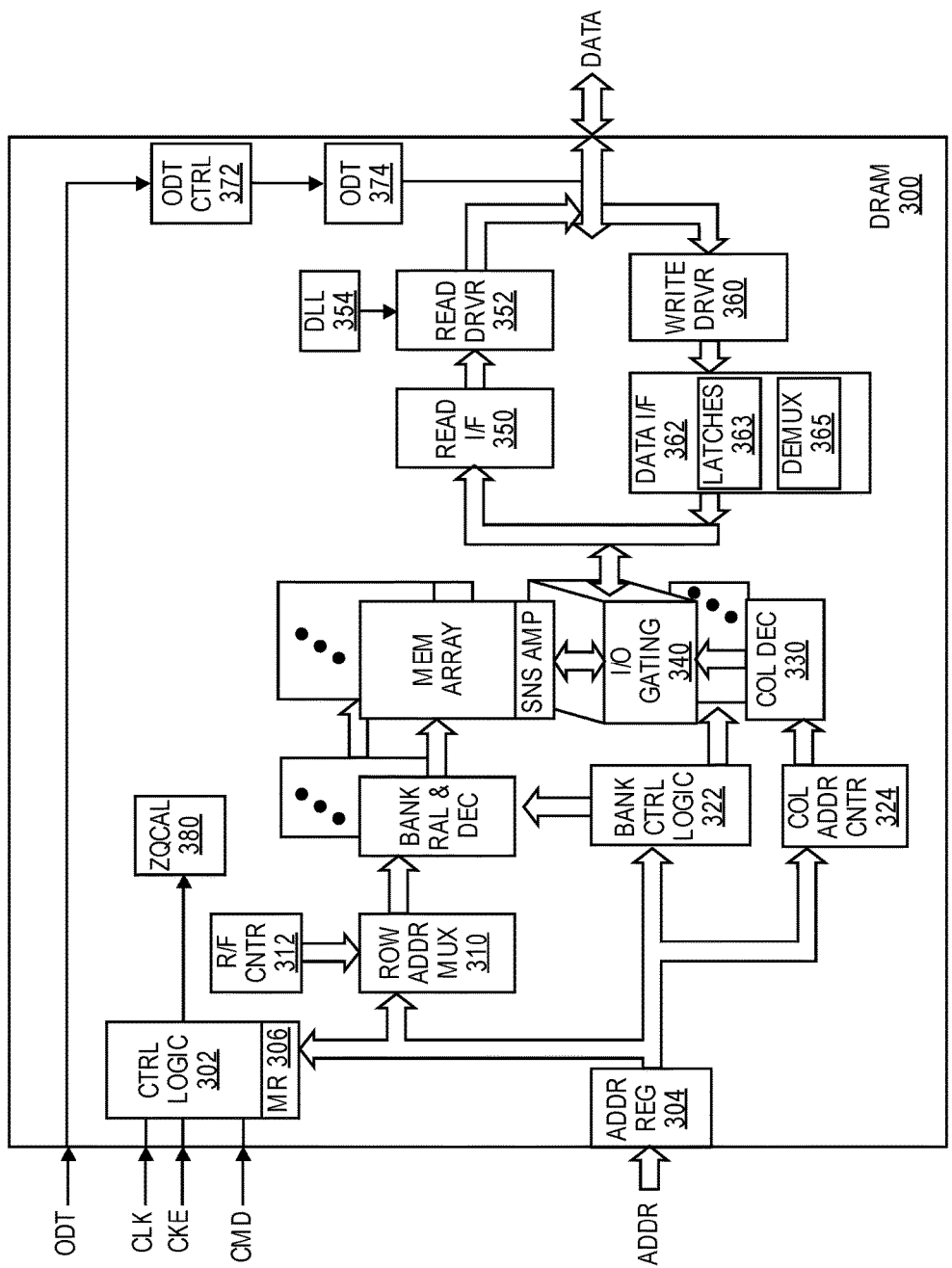
FIG. 3 is a block diagram of a memory device with control logic to perform repeated writes of a programmable data pattern, in accordance with an embodiment.

FIG. 3 is a block diagram of a memory device with control logic to perform repeated writes of a programmable data pattern, in accordance with an embodiment. DRAM 300 represents one example of a memory device in accordance with any system described herein that can use a DRAM to write a data pattern to multiple memory locations. Control logic 302 represents a controller or control logic within the memory device in accordance with any embodiment described herein. Control logic 302 receives clock (CLK), clock enable (CKE), and command (CMD) signals, and controls the operation of DRAM 300 in accordance with those signals. Control logic 302 can operate based on a setting stored in mode register(s) (MR) 306. The mode register(s) 306 can include one or more bits to control data status, as mentioned above. In one embodiment, control logic 302 provides control over memory banks in different bank groups, and generates multiple internal operations in response to a single command from the memory controller or host.

Address register 304 receives address information (ADDR) such as row address and bank address signals to identify the portion of memory to be affected by a particular command. Address register 304 distributes the address information to row address multiplexer 310, bank control logic 322, column address counter 324, and mode register 306.

Row address multiplexer 310 takes the row address information and a signal from refresh counter 312 as input, and controls the row address latch (RAL) and decoder for each bank group. The logic can be connected to multiple banks that make up the bank group. Bank control logic 322 selects which bank group will be selected for the memory access operation (command) received. Column address counter 324 generates a signal to select the column for the operation. In one embodiment, control logic 302 includes a counter (not explicitly shown) to internally generate bank group addresses and sequence through selected bank groups for a single command. Thus, one or more selected bank groups can be accessed for a single command.

The row address latch and decoder for the bank groups selects an address in the memory array(s) of the banks/bank groups, and the sense amplifiers can be activated, depending on the operation. I/O gating 340 can place data into the sense amplifiers for a write operation, and can read the data out for a read operation. Column decoder 330 receives the bank control logic selection and the column address counter selection and makes a column selection for I/O gating 340.

In one embodiment, DRAM 300 includes ZQCal 380 to provide impedance calibration functions with respect to data on the data bus. In one embodiment, DRAM 300 includes ODT (on die termination) control 372 to control input and/or output impedance circuits applied to the I/O to the data bus. ODT 374 represents the impedance circuits that can be applied in accordance with a configuration setting for impedance for DRAM 300 on a given transaction.

Read interface 350 is coupled to receive data bits from I/O gating 340 for a read operation. Read interface 350 can include a read latch and mux, and feeds selected output data into read driver 352, which will place the data on the signal lines of the data bus (DATA). The timing for driving the data bus is provided by DLL 354, which is controlled by control logic 302. Driver 352 can drive data strobe lines based on the timing to accompany the data signals.

Write driver 360 receives write data from the data bus, and inputs it into data latches (which can also be referred to as an input register or input buffer) of the write data interface 362. Data interface 362 can provide the data to I/O gating 340. The data interface 362 includes write data latches 363 and a demultiplexer 365 (for serial to parallel conversion), in accordance with embodiments. The data latches 363 generally receive the external write data from the data bus via I/O circuitry (e.g., a DRAM DQ receiver) and latch the external data by the clock toggling. The demultiplexer 365 (or other serial to parallel transformer) typically changes the serial double data rate (DDR) data format to a parallel data format, in accordance with embodiments. The data latches 363 latch the write data until the next new data arrives, in accordance with embodiments. Therefore, after performance of a write operation, the received data for that write operation is latched inside the DRAM die.

Referring again to I/O gating 340, in one embodiment, the I/O gating 340 includes write and read circuitry that is the same or similar to the write circuitry 254 and read circuitry 256 described above with respect to FIG. 2. For example, the I/O gating 340 can include one or more write drivers (e.g., internal write drivers between the sense amplifiers and the data interface 362, as distinguished from the write driver 360 between the data interface 362 and the external signal lines) to drive data into the sense amplifier to latch the new desired logic state. In existing memory devices, the write drivers write data into the memory cells based on the external data transmitted by a memory controller via the data bus. In contrast, in one embodiment, the write drivers in I/O gating 340 drive data into the memory array based on latched data from a previous write command or other sources depending on a register setting (e.g., the data status field described above). For example, the write drivers in I/O gating 340 can be controlled to write the data from the data bus, or alternatively, all zeros, all ones, or a different pattern based on a source internal to the memory die. In one embodiment, the data pattern is based on latched data (e.g., data latched in data latches 363 of the data interface 362). Therefore, in one such embodiment, the memory controller can control the data pattern to be written by a WRITE-F command by first transmitting a standard memory write command with the data pattern, which causes the data pattern to be latched in the data latches 363. Then, the memory controller can transmit the WRITE-F command without data, and the internal data latches 363 will keep the same data from the previous write command until new data is received with another regular write command.

In one embodiment, the memory device can include circuitry to internally compute memory addresses for one or more internal writes associated with a WRITE-F command. For example, in one embodiment, the DRAM 300 receives the WRITE-F command and an initial address (e.g., a row address and column address). The DRAM 300 can then store the data pattern to the address using the row and column address information transmitted from the memory controller. For subsequent WRITE-F commands (or for subsequent internal writes caused by a WRITE-F command), the DRAM can compute the next column address using counter circuitry (e.g., such as counter circuitry in the column address counter 324). The counter circuitry can compute the next column address using the initially transmitted column address (e.g., by incrementing the initially transmitted column address). Accordingly, the memory controller does not need to send address information over the address signal lines for each write. In other embodiments, the memory controller does send address information for each WRITE-F command.

Accordingly, in embodiments a write driver includes circuitry to select one of multiple sources to write a data pattern, which can enable reducing or eliminating the transmission of the data pattern over the data bus. The command and address information that the memory controller transmits can also be reduced, in accordance with embodiments.

Figure 4:
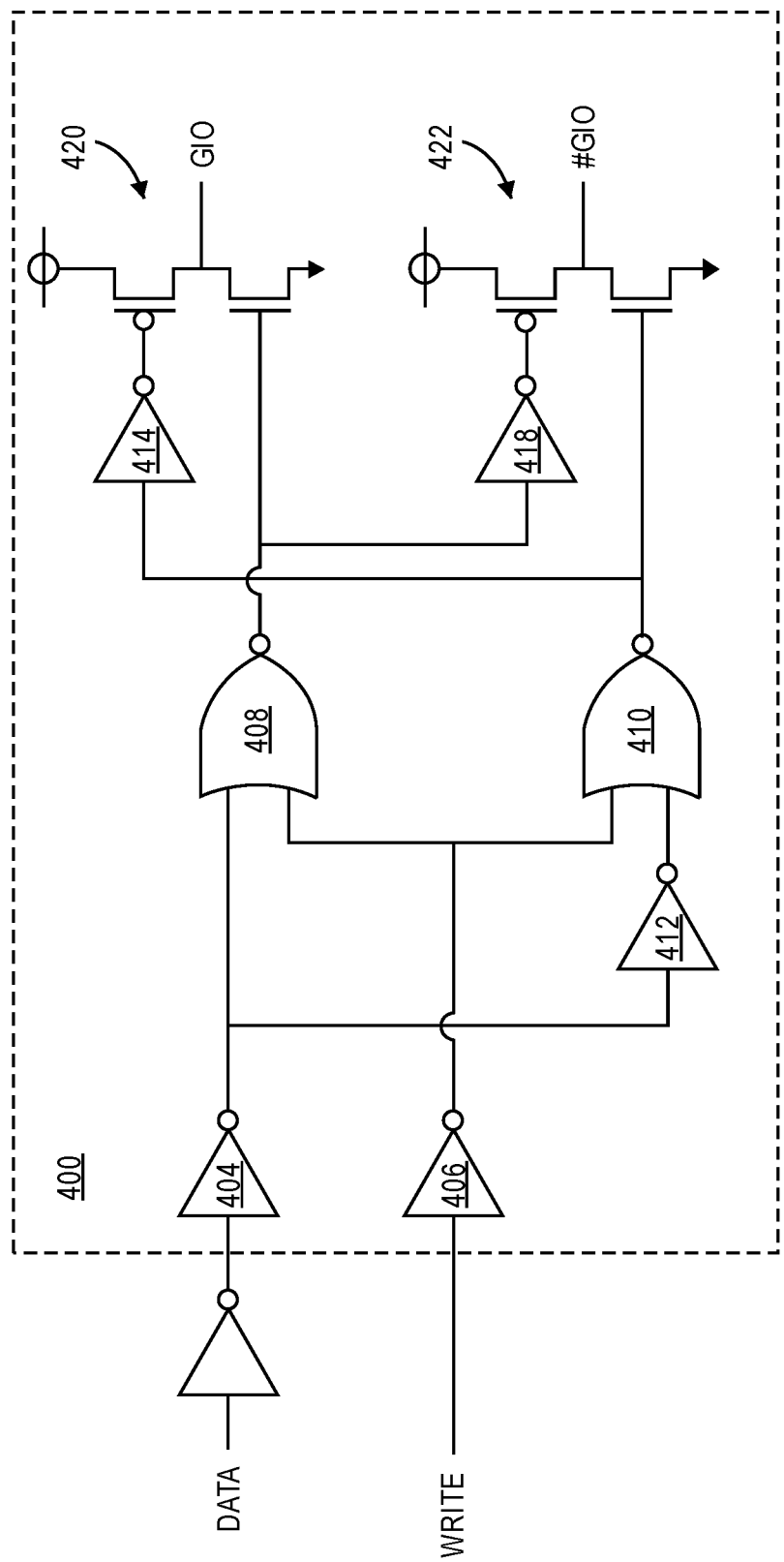
FIG. 4 is an example of a circuit logic diagram of a typical write driver of a memory device.

FIG. 4 is an example of a circuit logic diagram of a typical write driver 400 of a memory device, in accordance with an embodiment. In one embodiment, the write driver 400 includes circuitry to interface with a memory array and drive data into memory cells of the array. For example, a typical write driver can be located in the I/O gating block 340 of FIG. 3. The write driver circuit 400 receives a data signal (DATA) and a write enable signal (WRITE) as input. The write driver circuit 400 outputs global input/output (I/O) signals (GIO and #GIO).

The data on the data signal line is output on the global I/O lines when the write enable signal is asserted. For example, in the illustrated embodiment, the write driver circuit 400 includes an inverter 404 that receives a data signal (DATA) to the write driver circuit 400, and an inverter 406 that receives a write enable signal (WRITE). The illustrated write driver circuit 400 also includes a NOR gate 408 that receives the outputs of the inverters 404, 406 as input and a NOR gate 410 that receives the output of the inverter 406 and an output of an inverter 412, which receives the output of the inverter 404 as an input. The write driver circuit 400 also includes a pair of inverter circuits 420, 422 arranged in a push-pull amplifier configuration that drive associated global input/output (I/O) lines (GIO and #GIO signal lines). The inverter circuits 420, 422 drive the global I/O lines to a logic high or a logic low based on a pair of inputs defined by the outputs of the NOR gates 408, 410 and associated inverters 414, 418. Accordingly, in the illustrated embodiment, the data received on the data bus of the write driver circuit 400 is driven to the associated global I/O lines when the write enable signal is asserted. Thus, the data output from a typical write driver on the global I/O signal lines is from a single source: the data transmitted over the data bus for the current write command.

In contrast, as illustrated in FIG. 5, the output of a write driver can be based on the data bus or one or more other sources, in accordance with embodiments. FIG. 5 is a circuit logic diagram of a write driver of a memory device, in accordance with an embodiment. In one embodiment, the write driver 500 includes circuitry to interface with a memory array and drive data into memory cells of the array. For example, the write driver 500 can be located in the I/O gating block 340 of FIG. 3. In one embodiment, each bank in the memory array includes a write driver, such as the write driver 500 of FIG. 5.

Similar to FIG. 4, the write driver circuit 500 receives a data signal line (DATA) and a write enable signal (WRITE) as input, and outputs general input/output (I/O) signals (GIO and #GIO). However, unlike the write driver 400 of FIG. 4, the write driver circuit 500 includes circuitry to enable programming the source of data that is output on the general I/O signal lines. Specifically, in the embodiment illustrated in FIG. 5, the write driver circuit 500 includes a multiplexer 506 to select the source of data amongst data signal lines (DATA), a voltage source, or ground. In accordance with embodiments, the data signal lines ultimately couple with the data signal lines of the data bus between the memory device and the memory controller. However, there can be intermediate circuitry and one or more intermediate sets of internal data signal lines. The output 501 of the multiplexer 506 is input to the NOR gate 508 and to an inverter 504 that is input to another NOR gate 510. The write enable signal is input to an inverter 507, which is also input to the NOR gates 508, 510. The outputs of the NOR gates 508, 510 are input to the inverter circuits 520 and 522. The inverter circuits 520, 522 in the illustrated embodiment are configured as push-pull amplifiers, each of which includes a pair of matched transistors. The output of the NOR gate 508 is coupled to the gate of transistor T2 and input to an inverter 518, which has an output that is coupled with the gate of transistor T3. The output of NOR gate 510 is coupled to the gate of the transistor T4 and to an inverter 514, which has an output that is coupled to the transistor T1.

Unlike the typical write driver circuit 400 illustrated in FIG. 4, the write driver circuit 500 includes a multiplexer 506 to enable selection of one of multiple data sources. In one embodiment, the select input (SEL) of the multiplexer 506 is based on a value stored in a mode register. In one embodiment, a mode register includes one or more fields (such as the data status field described above) to indicate the source of the data pattern is to be written in response to a WRITE-F command. In one such embodiment, the mode register can include one or more fields to indicate whether the input to the multiplexer 506 is a data signal line or another input, such as ground or a voltage source. Thus, in one such embodiment, multiplexer 506 includes: an input coupled with a voltage source (input 1), an input coupled with a data signal line (input 2), and an input tied to ground (input 3). Other embodiments can include a multiplexer with fewer, more, or different inputs. In the illustrated embodiment, the data driver circuit 500 will output a 0 or 1 on the global I/O signal lines based on the selected input to the multiplexer 506. Accordingly, a memory device that includes write drivers such as the write driver 500 can enable flexibility in the data pattern to be written in response to a command.

Figures 6, 7:
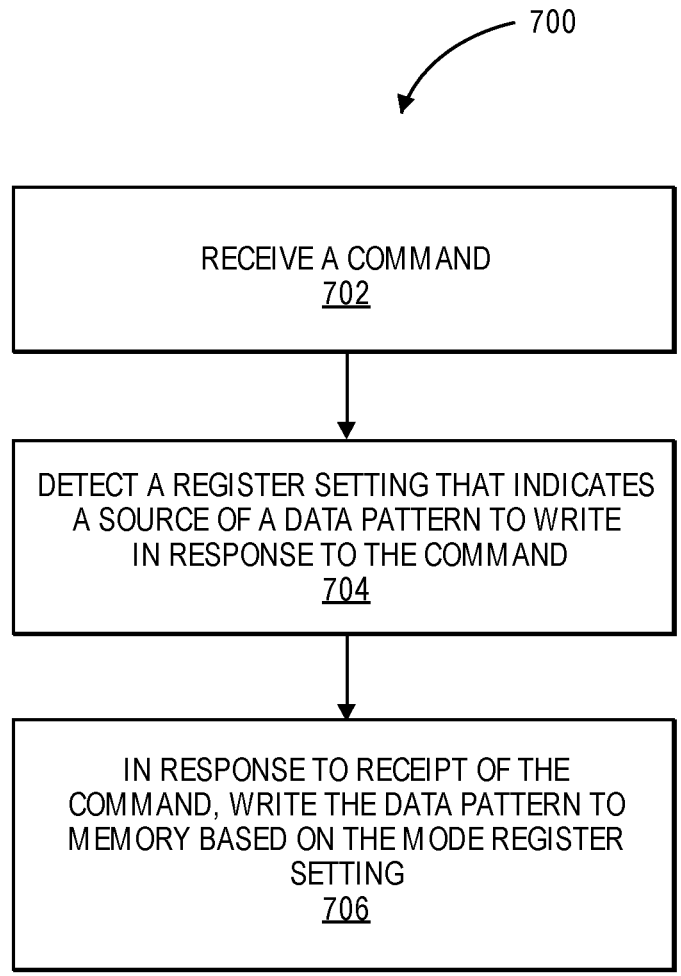
FIG. 6 is an example of a mode register for controlling a data pattern written to memory, in accordance with an embodiment.
FIG. 7 is a flow diagram of a method of writing a data pattern to memory, in accordance with an embodiment.

FIG. 6 is an example of a mode register for controlling a source of a data pattern written to memory, in accordance with an embodiment. Mode register 600 represents an embodiment of a mode register in a memory device or DRAM device in a system that supports writing a data pattern to multiple memory locations. Thus, mode register 600 can represent a mode register for a memory device in accordance with system 100 of FIG. 1 or system 200 of FIG. 2. In one embodiment, mode register 600 provides an example of how a mode register set (MRS) command can set a mode register configuration to indicate a source of a data pattern to be written to memory in response to a WRITE-F command.

Configuration setting 602 represents a field or one or more bits to control data status. In one such embodiment, setting 602 can be set to a value to indicate a source of a data pattern of all zeros (for example, a value of "1" in the setting 602 indicates an internal source of a data pattern of all zeros). In one embodiment, setting 602 can to be set to a value to indicate a source of a data pattern of all ones (for example, a value of "2" in the setting 602 indicates an internal source of a data pattern of all ones). In one embodiment, setting 602 can to be set to a value to indicate an external write data source (for example, a value of "0" in the setting 602 indicates that the data pattern is based on external write data). Note that although a data pattern based on external data is sometimes referred to as a pattern other than all zeros or all ones, the external data can be any combination of zeros and ones, including all zeros or all ones.

In one embodiment, the select input to a multiplexer in a write driver circuit is based on the value stored in the mode register 600. For example, referring to FIG. 5, the multiplexer 506 has a select input that is based on the value stored in a mode register such as mode register 600. In the examples illustrated in FIGS. 5 and 6, input 2 is selected if '0' is stored in setting 602 to indicate a data pattern is based on external write data; input 3 is selected if '1' is stored in setting 602 indicating a source of a data pattern of all zeros; and input 1 is selected if '2' is stored in setting 602 indicating a source of a data pattern of all ones. Thus, in the illustrated embodiment, if the data status register field is set to a value to indicate a data pattern of all zeros or all ones, the write drivers ignore or bypass the data present on the data signal lines (if any), and instead write all zeros or ones as indicated by the data status field. Otherwise, if the data status register field is set to a value to indicate that the data pattern is based on external data, the write drivers write the data pattern on the data signal lines (e.g., the data pattern stored in the data latches from a previous write).

In one embodiment, the data status field is initialized (e.g., upon system startup) to a value that causes the write drivers to write the data from the data signal lines in accordance with normal operation. For example, a DRAM can have a Power-On Reset to reset the mode register 600 to "0" as a default value during the power-on and before initialization. In one such embodiment, in order to bypass the data on the signal lines, the memory controller sends a command to program the data status field 602 to a value to select a data pattern source of all zeros or all ones. Additionally, the memory controller or memory device may need to reset or set the data status field to be in accordance with normal operation after completion of a WRITE-F command that bypasses the data signal lines. For example, in one embodiment, if the memory controller stores a value in the data status field 602 to indicate a data pattern of all zeros or all ones (e.g., a value of "1" or "2" as illustrated in FIG. 6), after completing the WRITE-F command(s), the memory controller resets the data status field to indicate that the data pattern is based on external write data (e.g., a value of "0" as illustrated in FIG. 6). Accordingly, in one embodiment, a mode register includes one or more bits to enable a programmable data pattern for writing to memory.

FIG. 7 is a flow diagram of a method of writing a data pattern to memory, in accordance with an embodiment. The method 700 of FIG. 7 can be performed by a memory device, such as the memory device 140 of FIG. 1 or the memory 230 of FIG. 2.

The method 700 begins with a memory device receiving a command from a memory controller, at operation 702. The command can cause the memory device to write a data pattern to one or more locations in memory. In one embodiment, the command can be one of multiple commands (e.g., a sequence of commands) to cause a data pattern to be written to multiple memory locations. In one embodiment, the command is a WRITE-F command that causes a data pattern to be written to memory without the transmission of the data pattern over the data bus for each write.

The method also involves detecting a mode register setting that indicates a source of a data pattern to write in response to the command, at operation 704. For example, in response to receipt of a WRITE-F command, the memory device can detect or determine what data pattern to write based on a mode register setting, such as the setting 602 of FIG. 6. In one such embodiment, the memory device determines that the data pattern to be written is from one of multiple sources, such as a source of a data pattern of all zeros, a source of a data pattern of all ones, data latches of the memory device, or another source.

In response to receipt of the command, the memory device writes the data pattern to memory based on the mode register setting, at operation 706. For example, in one embodiment, in response to receipt of a command (e.g., a WRITE-F command), the memory device writes a data pattern that is all zeros, all ones, or another data pattern based on mode register setting.

Figure 8A:
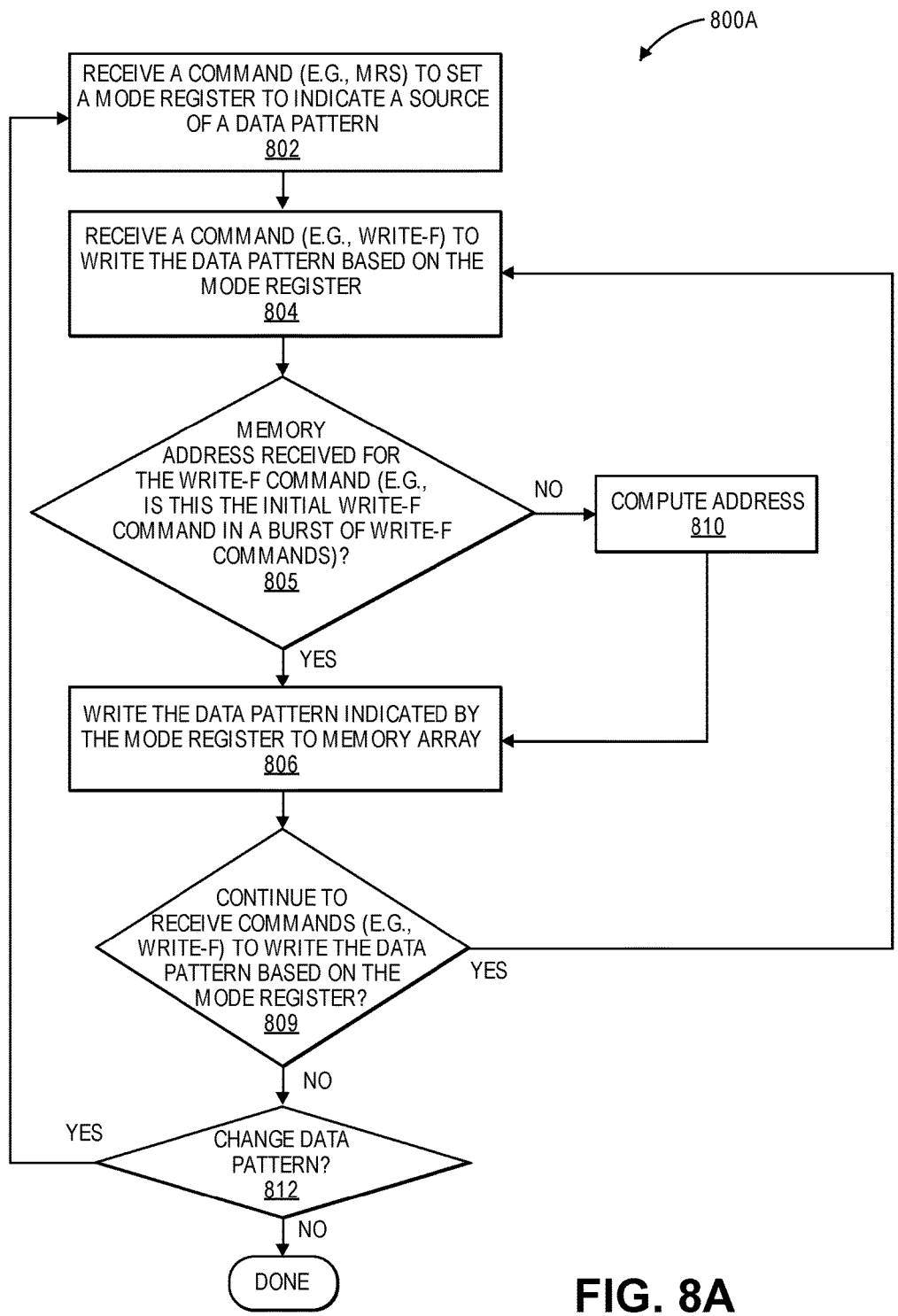
FIGS. 8A, 8B, 8C, and 8D are flow diagrams of methods of writing a data pattern to memory, in accordance with an embodiment.
Figure 8B:
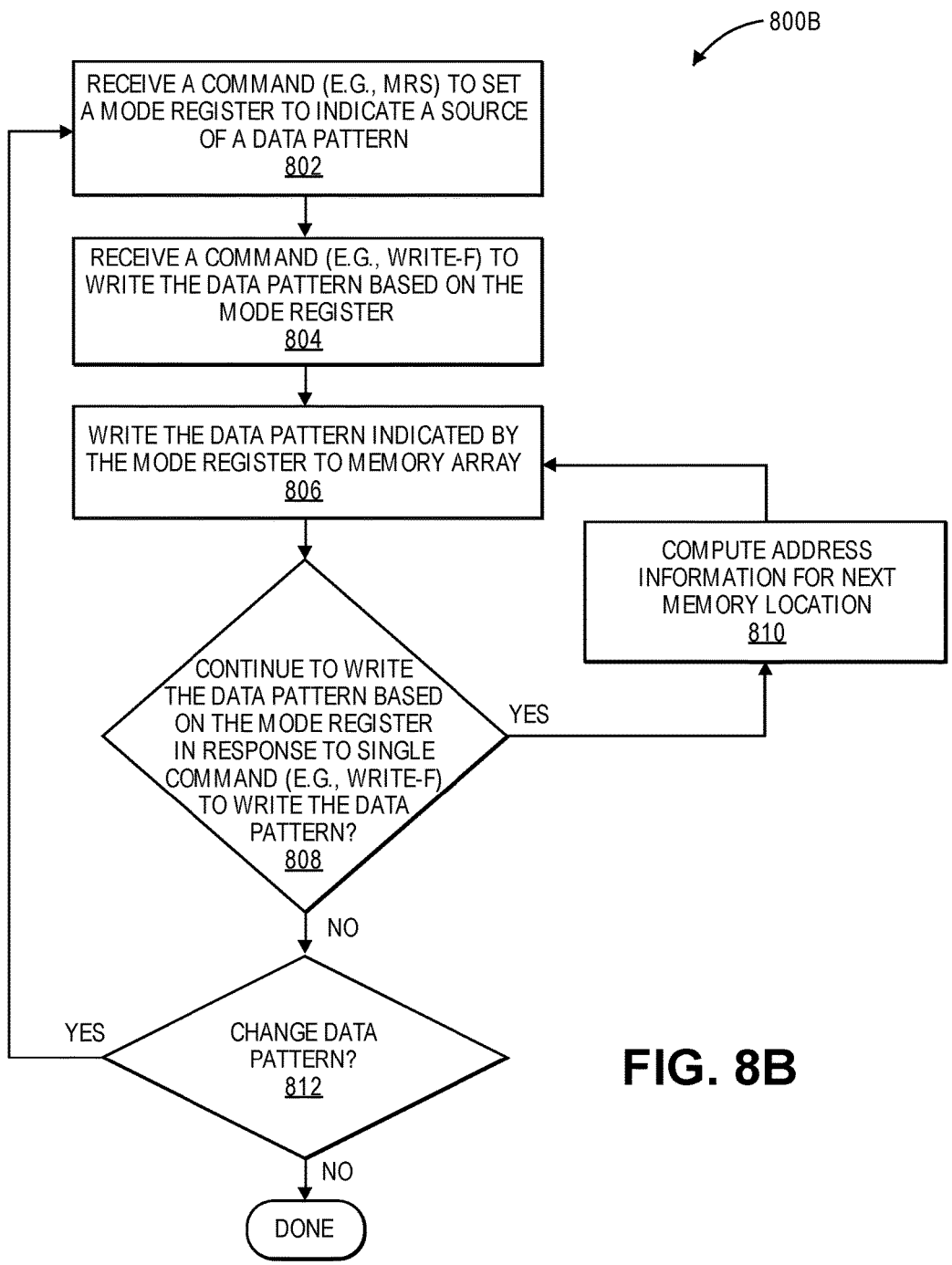
Figure 8C:
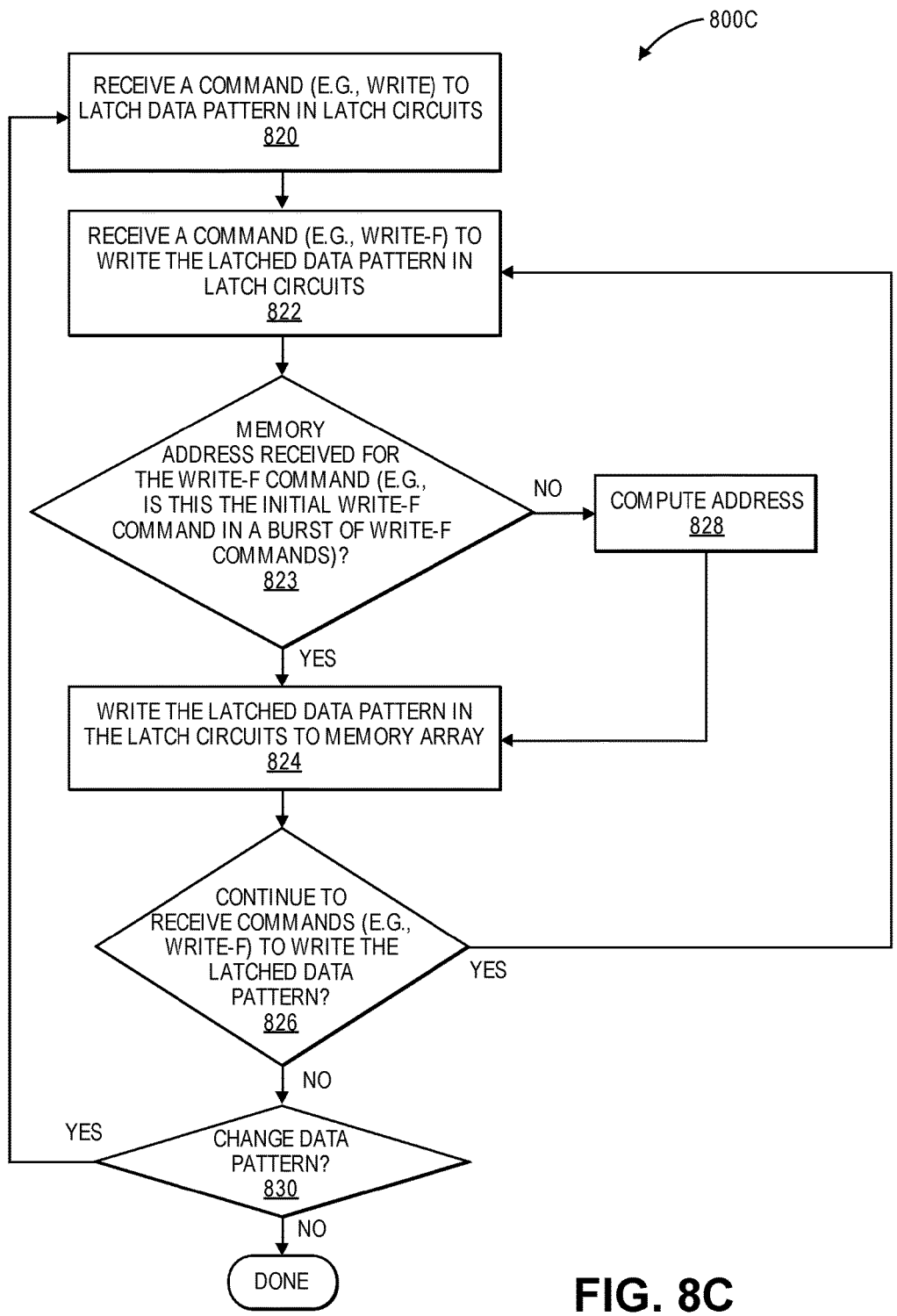
Figure 8D:
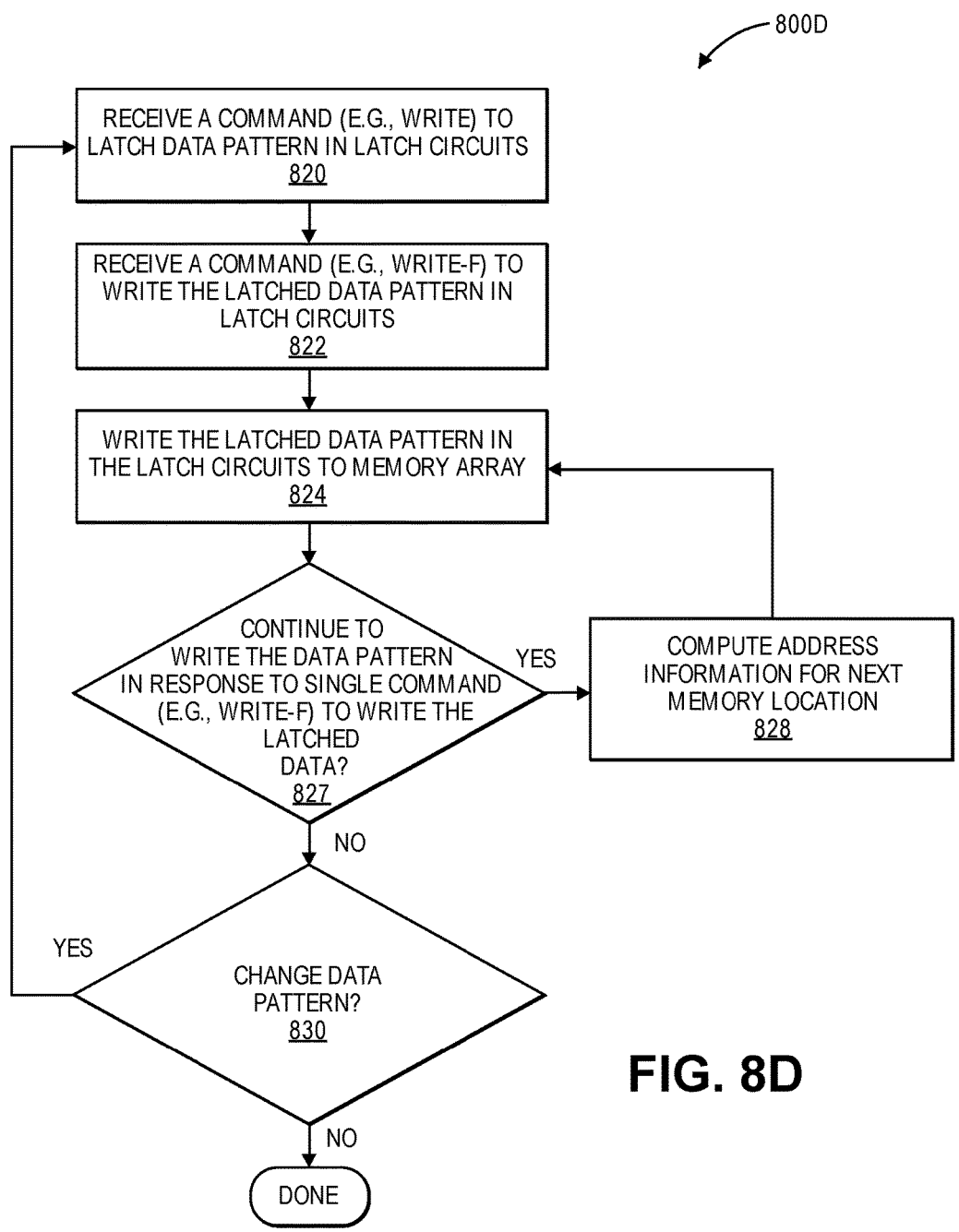

FIGS. 8A, 8B, 8C, and 8D are flow diagrams of methods of writing a data pattern to memory, in accordance with an embodiment. The methods 800A-800D can be performed by a memory device, such as the memory device 140 of FIG. 1 or the memory 230 of FIG. 2. The methods 800A-800D illustrate several methods for writing a data pattern to memory without transferring the data pattern over the data bus for each write. Other methods are also possible. The methods 800A of FIG. 8A and 800B of FIG. 8B illustrate embodiments in which the source of the data pattern is, for example, an input tied to ground or a voltage source. The methods 800C of FIG. 8C and 800D of FIG. 8D are similar to the methods 800A and 800B, but illustrate embodiments in which the data pattern is based on latched data from a prior memory write. FIGS. 8A and 8C illustrate embodiments in which a WRITE-F command is repeated for each write, whereas FIGS. 8B and 8D illustrate embodiments in which a single WRITE-F command causes multiple internal writes of the data pattern.

Referring to FIG. 8A, the method 800A begins with a memory device receiving a command to set a mode register to indicate a source of a data pattern, at operation 802. For example, the memory device can receive a mode register set (MRS) command from a memory controller to store a value in a mode register. In one such embodiment, the value stored in the mode register indicates which one of multiple data pattern sources is to be used in response to a command to write the data pattern. For example, the mode register can be set to values to indicate sources of data patterns that are all ones, all zeros, or another data pattern source.

The memory device also receives a command to write the data pattern to memory based on the mode register, at operation 804. For example, the memory device receives a WRITE-F command to write the data pattern to memory without receipt of the data pattern over the data bus. In the illustrated embodiment, the data pattern is not based on external data on the data bus. Instead, the source of the data pattern is indicated by a mode register, such as the mode register 600 of FIG. 6. For example, in one embodiment, the mode register indicates that the source of the data pattern is a source of all zeros, all ones, or another data pattern. For example, the mode register can indicate that the source is an input tied to ground or to a voltage source to write a data pattern of all zeros or all ones, respectively.

In some embodiments, the memory controller transmits address information (e.g., a row and/or column address) for each WRITE-F command. In other embodiments, the memory controller transmits address information for an initial WRITE-F command in a burst of WRITE-F commands, but not for the subsequent WRITE-F commands in the burst. Instead, in one such embodiment, the memory device computes the addresses for the subsequent WRITE-F commands. For example, in one embodiment the memory controller transmits a column address with the initial WRITE-F command, and the memory device computes (e.g., with counter circuitry) the next column addresses for subsequent WRITE-F commands. Accordingly, if the memory device received address information from the memory controller for the WRITE-F command, 805 YES branch, the memory device writes the data pattern indicated by the mode register to the memory array with the received address information, at operation 806. If the memory device did not receive address information from the memory controller for the WRITE-F command, 805 NO branch, the memory device computes the address information, at operation 810, and then writes the data pattern at operation 806. Thus, the memory controller can either transmit address information with each WRITE-F command, or can transmit address information for less than all WRITE-F commands. In one embodiment, the memory device does not include a counter for column address generation and the memory device captures subsequent WRITE-F commands with the external column address for each WRITE-F command. In another embodiment, column address generation or receipt of an external column address may be optional or programmable.

Referring again to operation 806, in response to the WRITE-F command, the memory device writes the data pattern indicated by the mode register to the memory array. For example, if the mode register contains a value that indicates a source of all zeros, the write circuitry of the memory device ignores the data on the external data lines (if any) and writes all zeros. For example, the data pattern can be based on an internal input or signal line in the memory device that is tied to ground. In another example, the register indicates a source of all ones, and the write circuitry of the memory device ignores the data on the external data lines and instead writes all ones. For example, the data pattern can be based on an internal input or signal line in the memory device that is tied to a voltage source. In one embodiment, the write circuitry can include a multiplexer to select the appropriate data pattern source to write the desired data pattern (e.g., such as the multiplexer in the write driver 500 of FIG. 5).

In one embodiment, the memory device continues to receive WRITE-F commands to write the data pattern based on the mode register. For example, the memory controller may transmit multiple back-to-back WRITE-F commands (e.g., as a burst operation). Accordingly, if the memory device continues to receive WRITE-F commands, 809 YES branch, then operations 804, 805, and 806 are repeated. Otherwise, if the memory device does not receive subsequent WRITE-F commands to write the same pattern, 809 NO branch, the data pattern can be changed. As mentioned above, after completion of writing the data pattern to multiple memory locations with the WRITE-F command, the mode register may need to be reset before resuming standard write operations. For example, if the data status register indicates that the data pattern should be all zeros, in one embodiment, the write driver includes circuitry to ignore the data from the data bus. Ignoring the data from the data bus is undesirable for most standard write commands. Therefore, the memory controller or memory device can cause the data status field to be set to a "normal" operating mode in which the write drivers write the data from the data bus. In one embodiment, in order to change the data pattern, operation 812 YES branch, the memory device can receive another command to set the mode register to a value to the desired data pattern source.

Thus, in contrast to a typical method of repeatedly writing a data pattern, the method of FIG. 8A can achieve the same result without transmitting information over the data bus for each write. In the case where the desired data pattern is all zeros, all ones, the memory controller is not required to transmit the data pattern even once before writing the data pattern to multiple memory locations. Also, in contrast to existing techniques that involve writing all zeros, the method of FIG. 8A enables the writing of memory patterns other than all zeros (such as all ones or another data pattern that includes both ones and zeros) to memory without transmitting the pattern over the data bus for each write.

FIG. 8B also illustrates an embodiment in which the source of the data pattern is, for example, an input tied to ground or a voltage source. Most of the operations of the method 800B of FIG. 8B are the same or similar to the operations of the method 800A. However, unlike the method 800A in which the memory device receives a command for each write of the data pattern (as indicated by operation 809), the method of 800B illustrates an embodiment in which a single command causes multiple writes of the data pattern to memory. For example, in the method 800B, the operations 806, 808, and 810 are repeated until all writes caused by the single command received at operation 804 are complete.

FIG. 8C is another flow diagram of a method of writing a data pattern to memory, in accordance with an embodiment. As mentioned above, FIG. 8C may illustrate an embodiment in which a data pattern source is a data latch of the memory device that stores data latched from a prior memory write. One aspect in which the illustrated embodiment in FIG. 8C differs from FIGS. 8A and 8B is that the method 800C does not include setting the mode register (e.g., the flow chart of FIG. 8C does not illustrate an operation comparable to operation 802 of FIG. 8A). In one such embodiment, the mode register does not need to be set because the default value (e.g., a value to which the mode register was initialized) indicates that the data pattern is to be based on external data. However, in another embodiment, the method 800C can include setting the mode register (e.g., receiving a command from the memory controller to set the mode register).

Therefore, assuming that the mode register indicates that the data pattern is to be based on external data (whether due to receipt of an MRS command or due to the initialization value being the desired value), the method 800C of FIG. 8C begins with receiving a command to latch a data pattern in latch circuits, at operation 820. In one embodiment, data is latched into data latches on the memory device when the memory device executes a standard write command, such as a WRITE command. Therefore, in one embodiment, a memory controller transmits a write command with the desired data pattern, and the memory device latches the data pattern. For example, referring to FIG. 3, the data interface logic 362 includes data latches 363 to latch data associated with a write command.

After the data is latched, the memory device can receive a command to write the latched data pattern to memory, at operation 822. For example, the memory device can receive a WRITE-F command as described above. In the embodiment illustrated in FIG. 8C, the mode register indicates that the source of the data pattern is a data latch of the memory device (e.g., a value of '0' in the data status field of the mode register 600 of FIG. 6).

Like FIG. 8A discussed above, in some embodiments, the memory controller transmits address information (e.g., a row and/or column address) for each WRITE-F command. In other embodiments, the memory controller transmits address information for an initial WRITE-F command in a burst of WRITE-F commands, but not for the subsequent WRITE-F commands in the burst. Instead, in one such embodiment, the memory device computes the addresses for the subsequent WRITE-F commands. For example, in one embodiment the memory controller transmits a column address with the initial WRITE-F command, and the memory device computes (e.g., with counter circuitry) the next column addresses for subsequent WRITE-F commands. Accordingly, if the memory device received address information from the memory controller for the WRITE-F command, 823 YES branch, the memory device writes the latched data pattern to the memory array, at operation 824. If the memory device did not receive address information from the memory controller for the WRITE-F command, 823 NO branch, the memory device computes the address information, at operation 828, and then writes the latched data pattern at operation 824. Thus, the memory controller can either transmit address information with each WRITE-F command, or can transmit address information for less than all WRITE-F commands.

Referring to operation 824, the memory device then writes the latched data pattern to memory. The memory device may continue to receive WRITE-F commands to write the same pattern, 826 YES branch, in which case operations 822, 823, and 824 are repeated. Otherwise, if the memory device does not continue to receive WRITE-F commands to write the same pattern, 826 NO branch, the data pattern may be changed. For example, if the data pattern needs to be changed (e.g., in order to write a different data pattern to multiple memory locations), operation 830 YES branch, the memory controller can transmit another write command with a different pattern, causing the memory device to latch the new data pattern, at operation 820. The source of the data pattern can also be changed by changing the register setting (such as described with respect to operations 812 and 802 of FIG. 8A). Otherwise, the method 800C as illustrated is done, 830 NO branch.

FIG. 8D also illustrates an embodiment in which the data pattern is based on latched data from a prior write command. Most of the operations of the method 800D of FIG. 8D are the same or similar to the operations of the method 800C. However, unlike the method 800C in which the memory device receives a command for each write of the data pattern (as indicated by operation 826), the method of 800D illustrates an embodiment in which a single command causes multiple writes of the data pattern to memory. For example, in the method 800D, the operations 824, 827, and 828 are repeated until all writes caused by the single command received at operation 822 are complete.

Figure 9A:
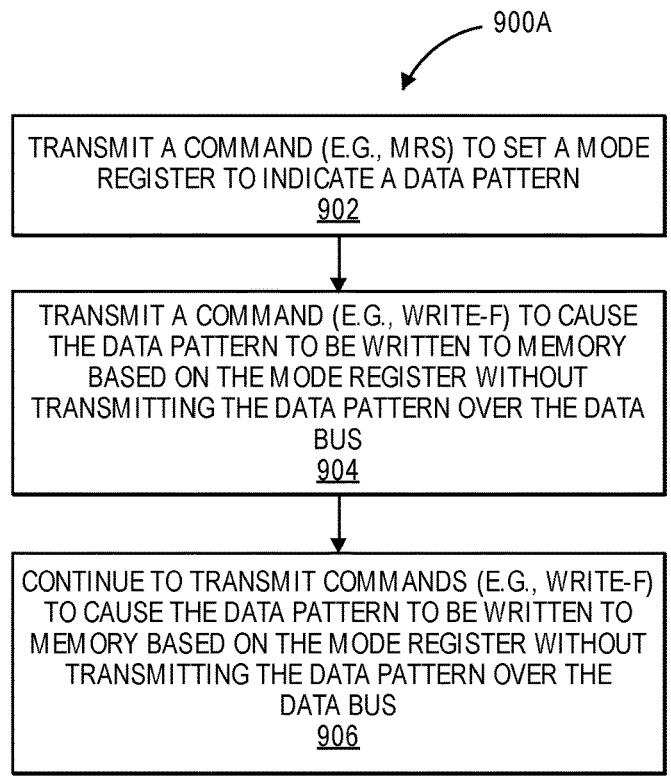
FIGS. 9A and 9B are flow diagrams of a method of writing a data pattern to memory, in accordance with an embodiment.
Figure 9B:
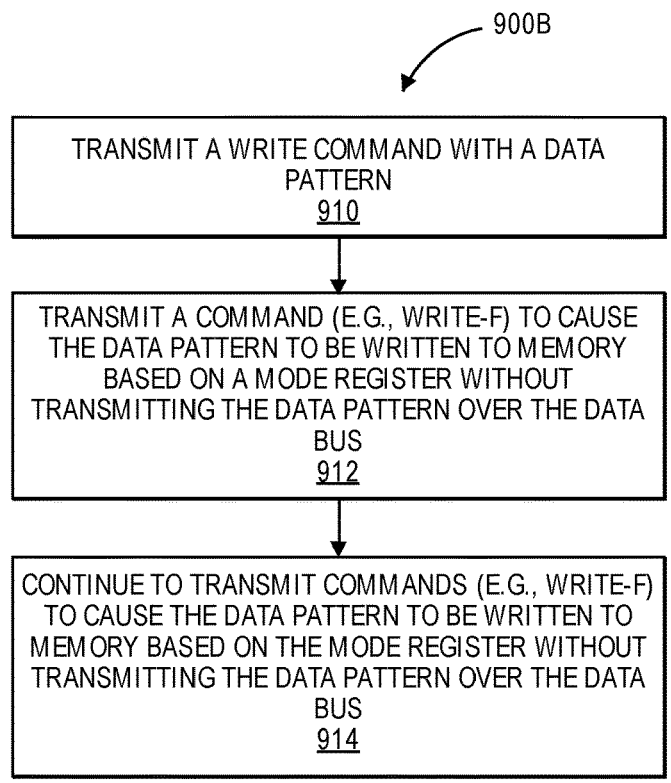

FIGS. 9A and 9B are flow diagrams of methods of writing a data pattern to memory, in accordance with embodiments. Unlike the methods of FIGS. 8A-8D, which can be performed by a memory device, FIGS. 9A and 9B illustrate methods performed by a memory controller, in accordance with an embodiment. For example, a memory controller such as the memory controller 120 of FIG. 1 or the memory controller 220 of FIG. 2 can perform the method 900A and 900B of FIGS. 9A and 9B. The method 900A illustrates a method in which the source of the data pattern is an input tied to ground, a voltage source, or another source, and the method 900B illustrates a method in which the source of the data pattern is a data latch that contains data from a prior write command. Thus, the method 900A illustrates a same or similar method as 800A or 800B, but from the memory controller's perspective instead of from the memory device's perspective. Similarly, the method 900B illustrates a same or similar method as 800C or 800D, but from the memory controller's perspective.

The method 900A begins with transmitting a command to set a mode register, at operation 902. For example, a memory controller can transmit a mode register set (MRS) command to store a value in a mode register to indicate a source of a data pattern (e.g., a source of a data pattern of all zeros, all ones, or a different source).

The memory controller also transmits a command to cause the data pattern to be written to memory, at operation 904. For example, in one embodiment, the memory controller transmits a WRITE-F command to a memory device. In one embodiment, the memory controller is not required to transmit the data pattern over the data bus, thus enabling a reduction in power consumption.

The memory controller can continue to transmit commands to cause the data pattern to be written to memory based on the mode register, at operation 906. For example, the memory controller can transmit back-to-back WRITE-F commands to the memory device. In one such embodiment, the memory controller only transmits address information with the initial WRITE-F command (e.g., the command referred to in operation 904), and does not transmit address information with subsequent WRITE-F commands (e.g., the commands referred to in operation 906). In other embodiments, the memory controller can transmit address information (e.g., column addresses) with each WRITE-F command.

The method 900B illustrates a method in which the data pattern is based on latched data. Accordingly, the method 900B involves transmitting a write command with the desired data pattern, at operation 910. For example, the memory controller transmits a single write command with the desired data pattern as write data. The memory device receives the write command and data, and latches the data as part of the process of storing the data in the memory cells.

After transmitting the write command to the memory device, the memory controller transmits a second command to cause the data pattern to be written to memory, at operation 912. For example, in one embodiment, the memory controller transmits a WRITE-F command to a memory device. In one such embodiment, the memory device uses the data pattern latched from the previous write command, and therefore the memory controller is not required to transmit the data pattern again with the WRITE-F command.

The memory controller can continue to transmit commands to cause the data pattern to be written to memory based on the mode register, at operation 914. For example, the memory controller can transmit back-to-back WRITE-F commands to the memory device. In one such embodiment, the memory controller only transmits address information with the initial WRITE-F command (e.g., the command referred to in operation 904), and does not transmit address information with subsequent WRITE-F commands (e.g., the commands referred to in operation 906). Thus, in accordance with embodiments, the memory controller can cause a data pattern to be written to multiple memory locations without transmitting the data pattern or address information for each write.

Figure 10A:
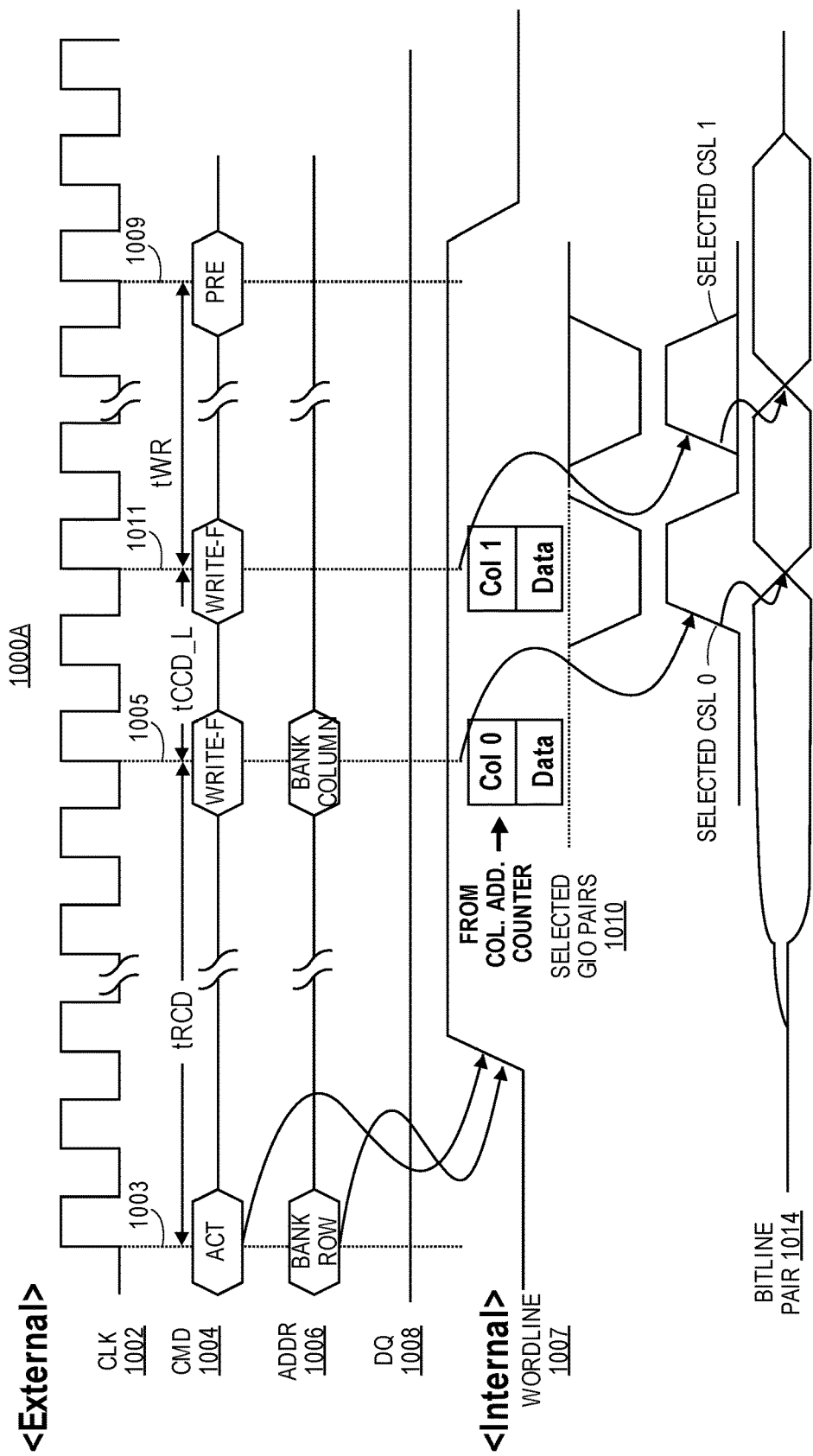
FIGS. 10A and 10B are timing diagrams showing operations for writing a data pattern to memory, in accordance with an embodiment.
Figure 10B:
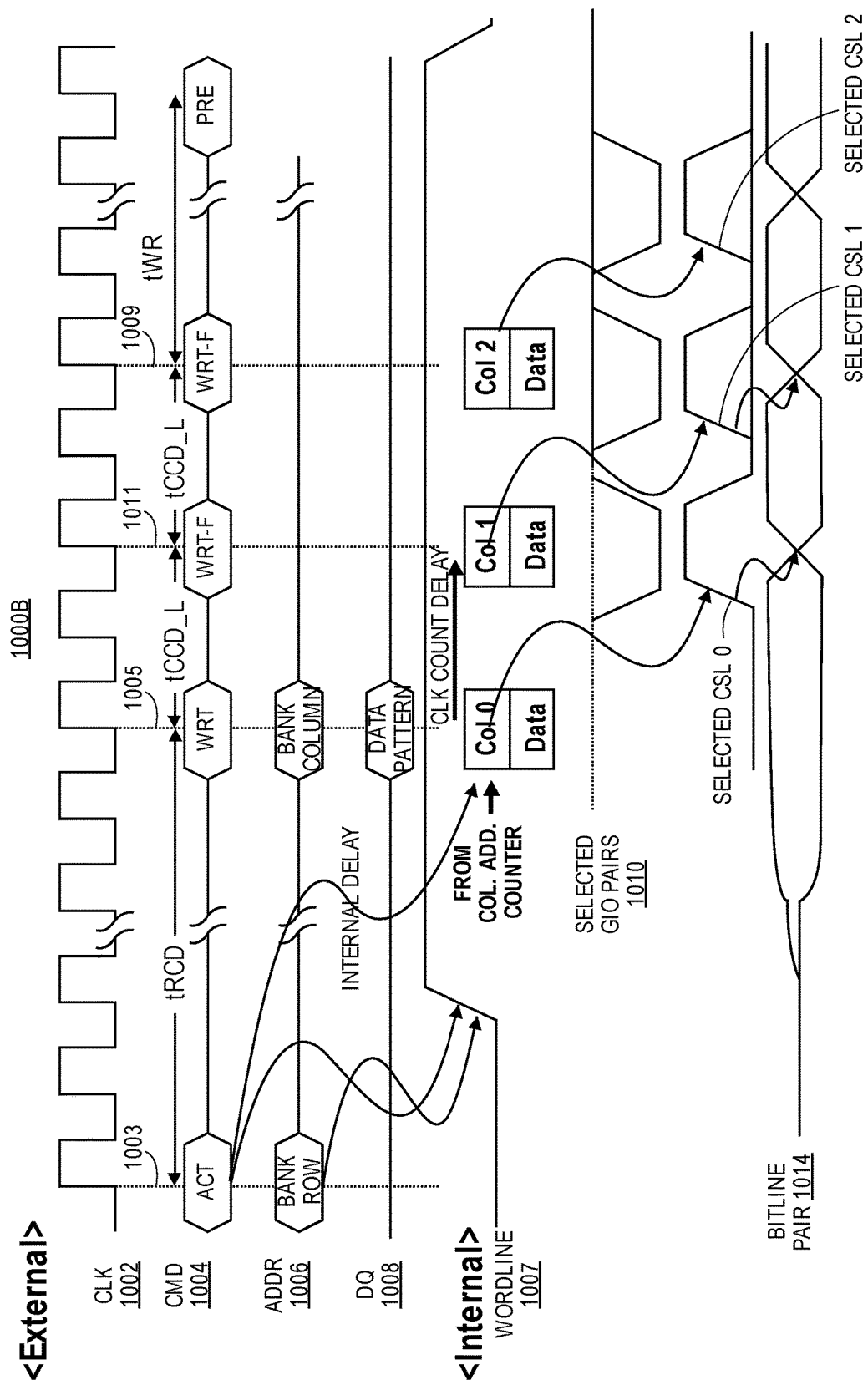

FIGS. 10A and 10B are timing diagrams showing operations for writing a data pattern to memory, in accordance with an embodiment. The timing diagrams 1000A and 1000B of FIGS. 10A and 10B illustrate selected timing elements, and is not necessarily a complete representation of all signals or operations that occur. Furthermore, the illustrated blocks do not necessarily convey scale or amount of time. Rather, the diagram illustrates relative order of operations. The timing diagram 1000A of FIG. 10A illustrates writing a data pattern based on a mode register in which the source of the data pattern is an input tied to ground or a voltage source (e.g., such as the methods 800A of FIG. 8A and 900A of FIG. 9A). The timing diagram 1000B of FIG. 10B illustrates writing a data pattern based on latched data (e.g., such as the methods 800A of FIG. 8A and 900A of FIG. 9A), in accordance with an embodiment.

Referring to FIG. 10A, the timing diagram illustrates signals transmitted over signal lines that interface a memory controller and memory device. For example, the timing diagram 1000A shows a clock signal 1002 (CLK), command signal 1004 (CMD), an address signal 1006 (ADDR), and a data signal 1008 (DQ), which enable communication between a memory controller and memory device. In accordance with an embodiment, the clock signal 1002, command signal 1004, address signal 1006, and data signal 1008 are external signal lines that couple the memory controller and memory device. The external signals in timing diagram 1000A can be in accordance with system 100 of FIG. 1 or system 200 of FIG. 2, or another system including a memory controller and memory device. The timing diagram 1000A also illustrates internal signals that are generated internally in the memory device and not used for communication with the memory controller. For example, the timing diagram illustrates wordline 1007, selected global input/output (I/O) pairs 1010 (note that in the illustrated embodiment the dotted line of the global I/O pairs 1010 represents the #GIO).

As mentioned above, timing diagram 1000A illustrates a case where a mode register (e.g., register 600 of FIG. 6) has been programmed to indicate that the source of the data pattern is not latched data from a previous write command. Instead, the data pattern is based on, for example, an input tied to ground or a voltage source. Thus, in the timing diagram 1000A, it is assumed that the memory controller already programmed the mode register to indicate the desired data pattern.

The timing diagram 1000A illustrates WRITE-F commands to cause the data pattern to be written to memory. In the embodiment illustrated in FIG. 10A, the memory controller transmits an activate command (ACT) via the command signal 1004 to activate a row (Bank Row) identified by the address signal 1006 at time 1003. The activate command causes an internal wordline signal 1007 to become asserted. After transmitting the activate command (e.g., after a time, tRCD, which is the ACT to internal read or write delay time of the memory device), the memory controller transmits a WRITE-F command. The memory controller also transmits a corresponding column address (Bank Column) to identify the memory location to which a data pattern is to be written. Note that the memory controller does not transmit data over the data line 1008 for the WRITE-F command. Instead, the memory device writes the data pattern in accordance with the mode register setting. For example, the memory device writes a data pattern of all zeros, all ones, or another data pattern.

After a period of time after the ACT command, the memory controller transmits a first write-force command (WRITE-F) via the command signal 1004 at time 1005. The period of time between the ACT command and the first WRITE-F command in the illustrated timing diagram is tRCD, although other time delays are possible. The memory device also transmits the column address (Bank Column) to the memory device for the WRITE-F command. The first WRITE-F command causes the selected global input/output pairs 1010 to reflect the data pattern, which cause assertion of the selected column select line (CSL). Assertion of the selected column assert line causes the data pattern to be driven onto the bitline pairs 1014, and thus stored in the selected memory cells of the memory device.

As illustrated in the timing diagram 1000A, the memory controller transmits a second WRITE-F command over the command signal lines 1004 at time 1011. Although only two WRITE-F commands are illustrated, the memory controller can issue fewer or additional WRITE-F commands. For example, consider an embodiment in which the page size activated by ACT with a Bank and Row address is generally 8 Kb or 1 Kb. For a page size of 8 Kb, we can select CSL lines by Column address and bring in and out 64b, 128b, or 256b of data, in accordance with embodiments. In an example where selection of the CSL lines enables 128b of data to be read or written in response to selection of the CSL lines, one WRITE-F operation can write the indicated data pattern into 128 memory cells of 8192b (8 Kb) memory cells. Therefore, in one such example, if the applications or the system want to write a data pattern to an entire page (e.g., 8192b in this example), the memory controller would cause 64 WRITE-F operations (based on 8192b/128b=64 writes). In this example, the 64 WRITE-F operations could occur in accordance with any embodiment described herein. For example, in one embodiment, a single WRITE-F command can cause enough internal write operations to fill the entire page with the data pattern. In another embodiment, the memory controller transmits a write or WRITE-F command for each write to fill the page with the data pattern. For example, in one such embodiment, the memory controller sends a WRITE-F command for each write. In another embodiment, the memory controller first sends a write command, followed by enough WRITE-F commands to fill the page with the data pattern (in the example above, 1 write command followed by 63 WRITE-F commands).

In the illustrated embodiment, the time delay between two back-to-back WRITE-F commands is tCCD_L, which is the long column to column delay (e.g., for commands to the same bank). The tCCD timing parameter defines the minimum number of cycles that must pass between selections of different columns of memory. However, in other embodiments, the time between the write and write-force commands could be tCCD_S, which is a short column to column delay (e.g., for commands to different banks), or some other period of time. In the illustrated embodiment, the memory controller does not transmit further address information via the address signal 1006 or data via the DQ signal 1008 for the subsequent WRITE-F command. Instead, the memory device determines the addresses of the next memory locations to which the data pattern is to be written in response to receipt of the WRITE-F command rather than relying on the receipt of additional address information over the address signal lines. For example, counter circuitry (e.g., a column address counter) on the memory device computes the column address for the subsequent WRITE-F commands. The memory device continues to write the data pattern to additional columns of the selected row until the memory device ceases to receive WRITE-F commands. The memory device therefore writes the data pattern to multiple memory locations without receiving the data pattern or address for each write.

After the last column write has completed, the word line and column lines may be deactivated by a precharge command (PRE) at time 1009, which the memory controller can issue after the last column write by an amount of time defined by the Write Recovery time (tWR) of the memory device. As discussed above, the tWR timing parameter defines the minimum number of clock cycles required after a write operation to ensure the written contents are properly stored in the corresponding memory cells.

The timing diagram 1000B illustrates a write command with a data pattern, followed by a WRITE-F command to cause the latched data pattern to be written to multiple memory locations. The timing diagram 100B illustrates signals that are similar to the timing diagram 1000A. For example, the timing diagram 1000 shows a clock signal 1002 (CLK), command signal 1004 (CMD), an address signal 1006 (ADDR), and a data signal 1008 (DQ), which enable communication between a memory controller and memory device. The signals in timing diagram 1000 can be in accordance with system 100 of FIG. 1 or system 200 of FIG. 2, or another system including a memory controller and memory device.

As mentioned above, the timing diagram 1000B first illustrates a memory write command. Thus, in the embodiment illustrated in FIG. 10, the memory controller transmits an activate command (ACT) via the command signal 1004 to activate a row (Bank Row) identified by the address signal 1006 at time 1003. The activate command causes an internal wordline signal 1007 to become asserted. After transmitting the activate command (e.g., after a time, tRCD, which is the ACT to internal read or write delay time of the memory device), the memory controller transmits a write command (WRT) at time 1005. The memory controller also transmits a corresponding column address (Bank Column) to identify the memory location to which the data (Data Pattern) on DQ 1008 is to be written. The write command causes the data to be latched and output on the selected global I/O pairs 1010, which cause the selected column select line to become asserts, which causes the data to be output to the bitline pairs 1014, and then written to the specified memory location. Thus, as discussed above, the handling of the write command causes the memory device to latch the data prior to storing in the memory cells. The latched data can then be used by the memory device to handle a subsequent WRITE-F command.

After a period of time the memory controller transmits a write-force command (WRITE-F) via the command signal 1004. The period of time between the write and write-force command in the illustrated timing diagram is tCCD_L, however, in other embodiments, the time between the write and write-force commands could be tCCD_S, which is a short column to column delay (e.g., for commands to different banks), or some other period of time. In the illustrated embodiment, the memory controller does not transmit further address information via the address signal 1006 or data via the DQ signal 1008 for the write-force command. Instead, as discussed above with respect to FIG. 10A, the memory device determines the addresses of the next memory locations to which the data pattern is to be written in response to receipt of the WRITE-F command rather than relying on the receipt of additional address information over the address signal lines 1006.

The memory device continues to write the data pattern to additional columns of the selected row until the memory device ceases to receive WRITE-F commands. In the illustrated example, delay between given writes is tCCD_L, although in other embodiments the delay could be tCCD_S or another delay. The timing diagram 1000B illustrates two WRITE-F commands, but the memory controller can issue fewer or additional WRITE-F commands, in accordance with embodiments. The memory device therefore writes the data pattern to multiple memory locations without receiving the data pattern or address for each write.

After the last column write has completed, the word line and column lines may be deactivated by a precharge command (PRE) at time 1009, which the memory controller can issue after the last column write by an amount of time defined by the Write Recovery time (tWR) of the memory device.

Thus, the timing diagrams 1000A and 1000B illustrate WRITE-F commands in accordance with embodiments. The timing diagrams 1000A and 1000B are merely examples, and other embodiments can include different timing and features. For example, the timing diagrams 1000A and 1000B illustrate embodiments in which the memory controller transmits a WRITE-F command over the command bus for each subsequent write. However, in other embodiments, a single command can cause a memory device to perform multiple internal writes. In another example, other embodiments can involve transmission of address information for each write instead of the memory device computing subsequent column addresses.

Figure 11:
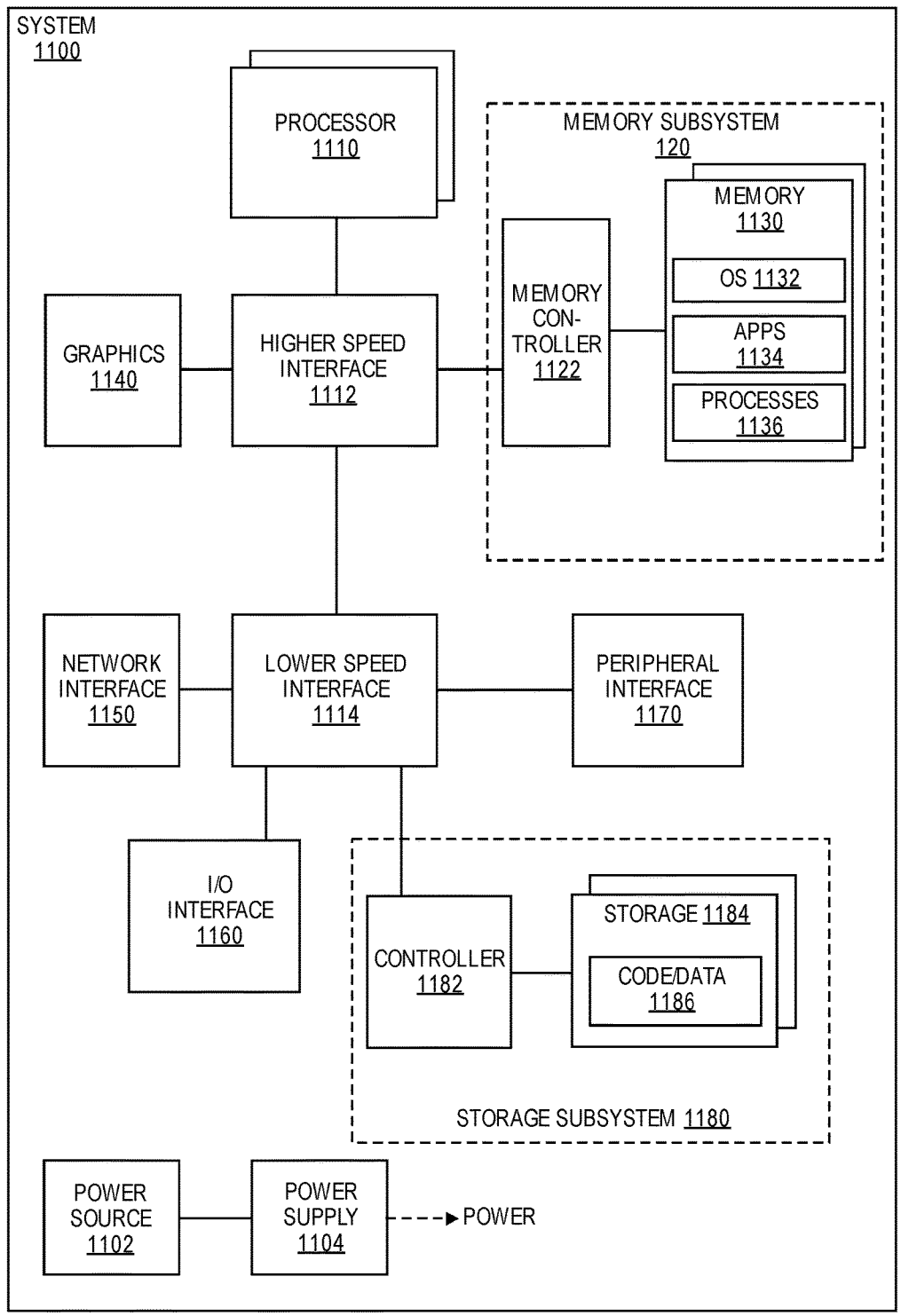
FIG. 11 is a block diagram of a computing system in which repeated writes of a programmable data pattern to memory can be implemented, in accordance with an embodiment.

FIG. 11 is a block diagram of a computing system in which repeated writes of a programmable data pattern to memory can be implemented, in accordance with an embodiment.

System 1100 represents a computing device in accordance with any embodiment described herein, and can be a laptop computer, a desktop computer, a server, a gaming or entertainment control system, a scanner, copier, printer, routing or switching device, embedded computing device, or other electronic device.

System 1100 includes processor 1110, which provides processing, operation management, and execution of instructions for system 1100. Processor 1110 can include any type of microprocessor, central processing unit (CPU), graphics processing unit (GPU), processing core, or other processing hardware to provide processing for system 1100, or a combination of processors. Processor 1110 controls the overall operation of system 1100, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 1100 includes interface 1112 coupled to processor 1110, which can represent a higher speed interface or a high throughput interface for system components that needs higher bandwidth connections, such as memory subsystem 1120 or graphics interface components 1140. Interface 1112 can represent a "north bridge" circuit, which can be a standalone component or integrated onto a processor die. Graphics interface 1140 interfaces to graphics components for providing a visual display to a user of system 1100. In one embodiment, graphics interface 1140 generates a display based on data stored in memory 1130 or based on operations executed by processor 1110 or both.

Memory subsystem 1120 represents the main memory of system 1100, and provides storage for code to be executed by processor 1110, or data values to be used in executing a routine. Memory subsystem 1120 can include one or more memory devices 1130 such as read-only memory (ROM), flash memory, one or more varieties of random access memory (RAM), or other memory devices, or a combination of such devices.

Memory 1130 stores and hosts, among other things, operating system (OS) 1132 to provide a software platform for execution of instructions in system 1100. Additionally, applications 1134 can execute on the software platform of OS 1132 from memory 1130. Applications 1134 represent programs that have their own operational logic to perform execution of one or more functions. Processes 1136 represent agents or routines that provide auxiliary functions to OS 1132 or one or more applications 1134 or a combination. OS 1132, applications 1134, and processes 1136 provide logic to provide functions for system 1100. In one embodiment, memory subsystem 1120 includes memory controller 1122, which is a memory controller to generate and issue commands to memory 1130. It will be understood that memory controller 1122 could be a physical part of processor 1110 or a physical part of interface 1112. For example, memory controller 1122 can be an integrated memory controller, integrated onto a circuit with processor 1110.

While not specifically illustrated, it will be understood that system 1100 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire").

In one embodiment, system 1100 includes interface 1114, which can be coupled to interface 1112. Interface 1114 can be a lower speed interface than interface 1112. In one embodiment, interface 1114 can be a "south bridge" circuit, which can include standalone components and integrated circuitry. In one embodiment, multiple user interface components or peripheral components, or both, couple to interface 1114. Network interface 1150 provides system 1100 the ability to communicate with remote devices (e.g., servers or other computing devices) over one or more networks. Network interface 1150 can include an Ethernet adapter, wireless interconnection components, USB (universal serial bus), or other wired or wireless standards-based or proprietary interfaces. Network interface 1150 can exchange data with a remote device, which can include sending data stored in memory or receiving data to be stored in memory.

In one embodiment, system 1100 includes one or more input/output (I/O) interface(s) 1160. I/O interface 1160 can include one or more interface components through which a user interacts with system 1100 (e.g., audio, alphanumeric, tactile/touch, or other interfacing). Peripheral interface 1170 can include any hardware interface not specifically mentioned above. Peripherals refer generally to devices that connect dependently to system 1100. A dependent connection is one where system 1100 provides the software platform or hardware platform or both on which operation executes, and with which a user interacts.

In one embodiment, system 1100 includes storage subsystem 1180 to store data in a nonvolatile manner. In one embodiment, in certain system implementations, at least certain components of storage 1180 can overlap with components of memory subsystem 1120. Storage subsystem 1180 includes storage device(s) 1184, which can be or include any conventional medium for storing large amounts of data in a nonvolatile manner, such as one or more magnetic, solid state, or optical based disks, or a combination. Storage 1184 holds code or instructions and data 1186 in a persistent state (i.e., the value is retained despite interruption of power to system 1100). Storage 1184 can be generically considered to be a "memory," although memory 1130 is typically the executing or operating memory to provide instructions to processor 1110. Whereas storage 1184 is nonvolatile, memory 1130 can include volatile memory (i.e., the value or state of the data is indeterminate if power is interrupted to system 1100). In one embodiment, storage subsystem 1180 includes controller 1182 to interface with storage 1184. In one embodiment controller 1182 is a physical part of interface 1114 or processor 1110, or can include circuits or logic in both processor 1110 and interface 1114.

Power source 1102 provides power to the components of system 1100. More specifically, power source 1102 typically interfaces to one or multiple power supplies 1104 in system 1100 to provide power to the components of system 1100. In one embodiment, power supply 1104 includes an AC to DC (alternating current to direct current) adapter to plug into a wall outlet. Such AC power can be renewable energy (e.g., solar power) power source 1102. In one embodiment, power source 1102 includes a DC power source, such as an external AC to DC converter. In one embodiment, power source 1102 or power supply 1104 includes wireless charging hardware to charge via proximity to a charging field. In one embodiment, power source 1102 can include an internal battery or fuel cell source.

In one embodiment, the memory subsystem 1120 enable a programmable data pattern for multiple writes to memory in accordance with embodiments described above.

Figure 12:
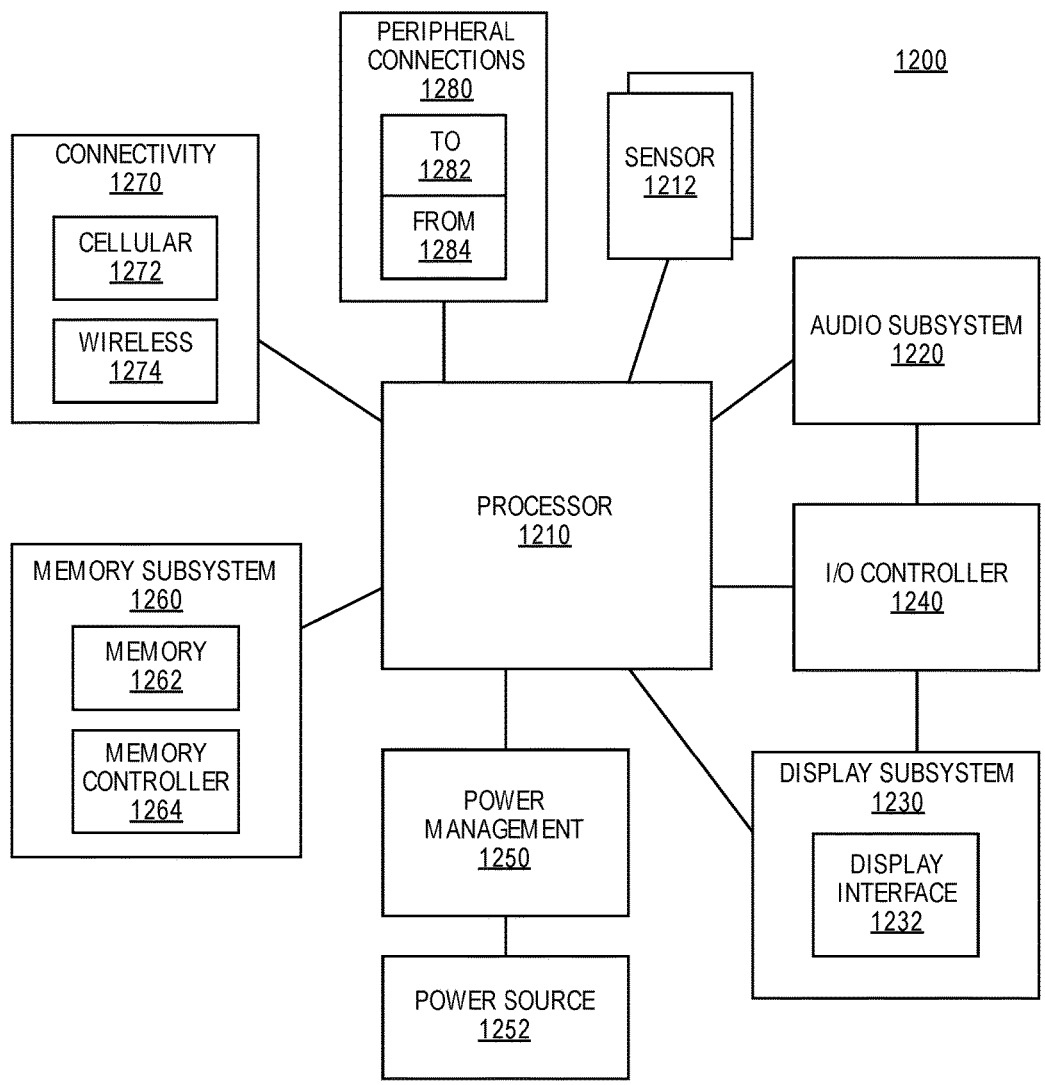
FIG. 12 is a block diagram of a mobile device in which repeated writes of a programmable data pattern to memory can be implemented, in accordance with an embodiment.

FIG. 12 is a block diagram of a mobile device in which a method of writing a data pattern to multiple memory locations can be implemented, in accordance with an embodiment. Device 1200 represents a mobile computing device, such as a computing tablet, a mobile phone or smartphone, a wireless-enabled e-reader, wearable computing device, or other mobile device, or an embedded computing device. It will be understood that certain of the components are shown generally, and not all components of such a device are shown in device 1200.

Device 1200 includes processor 1210, which performs the primary processing operations of device 1200. Processor 1210 can include one or more physical devices, such as microprocessors, application processors, microcontrollers, programmable logic devices, or other processing means. The processing operations performed by processor 1210 include the execution of an operating platform or operating system on which applications and device functions are executed. The processing operations include operations related to I/O (input/output) with a human user or with other devices, operations related to power management, operations related to connecting device 1200 to another device, or a combination. The processing operations can also include operations related to audio I/O, display I/O, or other interfacing, or a combination. Processor 1210 can execute data stored in memory. Processor 1210 can write or edit data stored in memory.

In one embodiment, system 1200 includes one or more sensors 1212. Sensors 1212 represent embedded sensors or interfaces to external sensors, or a combination. Sensors 1212 enable system 1200 to monitor or detect one or more conditions of an environment or a device in which system 1200 is implemented. Sensors 1212 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, glucose monitors, or other sensors to detect medical or physiological attributes), or other sensors, or a combination. Sensors 1212 can also include sensors for biometric systems such as fingerprint detectors, face detection or recognition systems, or other systems that detect or recognize user features. Sensors 1212 should be understood broadly, and not limiting on the many different types of sensors that could be implemented with system 1200. In one embodiment, one or more sensors 1212 couples to processor 1210 via a frontend circuit integrated with processor 1210. In one embodiment, one or more sensors 1212 couples to processor 1210 via another component of system 1200.

In one embodiment, device 1200 includes audio subsystem 1220, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 1200, or connected to device 1200. In one embodiment, a user interacts with device 1200 by providing audio commands that are received and processed by processor 1210.

Display subsystem 1230 represents hardware (e.g., display devices) and software components (e.g., drivers) that provide a visual display for presentation to a user. In one embodiment, the display includes tactile components or touchscreen elements for a user to interact with the computing device. Display subsystem 1230 includes display interface 1232, which includes the particular screen or hardware device used to provide a display to a user. In one embodiment, display interface 1232 includes logic separate from processor 1210 (such as a graphics processor) to perform at least some processing related to the display. In one embodiment, display subsystem 1230 includes a touchscreen device that provides both output and input to a user. In one embodiment, display subsystem 1230 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, display subsystem 1230 generates display information based on data stored in memory and operations executed by processor 1210.

I/O controller 1240 represents hardware devices and software components related to interaction with a user. I/O controller 1240 can operate to manage hardware that is part of audio subsystem 1220, or display subsystem 1230, or both. Additionally, I/O controller 1240 illustrates a connection point for additional devices that connect to device 1200 through which a user might interact with the system. For example, devices that can be attached to device 1200 might include microphone devices, speaker or stereo systems, video systems or other display device, keyboard or keypad devices, or other I/O devices for use with specific applications such as card readers or other devices.

As mentioned above, I/O controller 1240 can interact with audio subsystem 1220 or display subsystem 1230 or both. For example, input through a microphone or other audio device can provide input or commands for one or more applications or functions of device 1200. Additionally, audio output can be provided instead of or in addition to display output. In another example, if display subsystem includes a touchscreen, the display device also acts as an input device, which can be at least partially managed by I/O controller 1240. There can also be additional buttons or switches on device 1200 to provide I/O functions managed by I/O controller 1240.

In one embodiment, I/O controller 1240 manages devices such as sensors 1212, accelerometers, cameras, light sensors or other environmental sensors, gyroscopes, global positioning system (GPS), or other hardware that can be included in device 1200. The input can be part of direct user interaction, as well as providing environmental input to the system to influence its operations (such as filtering for noise, adjusting displays for brightness detection, applying a flash for a camera, or other features).

In one embodiment, device 1200 includes power management 1250 that manages battery power usage, charging of the battery, and features related to power saving operation. Power management 1250 manages power from power source 1252, which provides power to the components of system 1200. In one embodiment, power source 1252 includes an AC to DC (alternating current to direct current) adapter to plug into a wall outlet. Such AC power can be renewable energy (e.g., solar power, motion based power). In one embodiment, power source 1252 includes only DC power, which can be provided by a DC power source, such as an external AC to DC converter. In one embodiment, power source 1252 includes wireless charging hardware to charge via proximity to a charging field. In one embodiment, power source 1252 can include an internal battery or fuel cell source.

Memory subsystem 1260 includes memory device(s) 1262 for storing information in device 1200. Memory subsystem 1260 can include nonvolatile (state does not change if power to the memory device is interrupted) or volatile (state is indeterminate if power to the memory device is interrupted) memory devices, or a combination. Memory 1260 can store application data, user data, music, photos, documents, or other data, as well as system data (whether long-term or temporary) related to the execution of the applications and functions of system 1200. In one embodiment, memory subsystem 1260 includes memory controller 1264 (which could also be considered part of the control of system 1200, and could potentially be considered part of processor 1210). Memory controller 1264 includes a scheduler to generate and issue commands to memory device 1262. The device 1200 also include a storage subsystem 1206. The storage subsystem 1206 includes one or more storage devices 1201 and a controller 1205 for controlling access to the storage devices 1201.

Connectivity 1270 includes hardware devices (e.g., wireless or wired connectors and communication hardware, or a combination of wired and wireless hardware) and software components (e.g., drivers, protocol stacks) to enable device 1200 to communicate with external devices. The external device could be separate devices, such as other computing devices, wireless access points or base stations, as well as peripherals such as headsets, printers, or other devices. In one embodiment, system 1200 exchanges data with an external device for storage in memory or for display on a display device. The exchanged data can include data to be stored in memory, or data already stored in memory, to read, write, or edit data.

Connectivity 1270 can include multiple different types of connectivity. To generalize, device 1200 is illustrated with cellular connectivity 1272 and wireless connectivity 1274. Cellular connectivity 1272 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1274 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1280 include hardware interfaces and connectors, as well as software components (e.g., drivers, protocol stacks) to make peripheral connections. It will be understood that device 1200 could both be a peripheral device ("to" 1282) to other computing devices, as well as have peripheral devices ("from" 1284) connected to it. Device 1200 commonly has a "docking" connector to connect to other computing devices for purposes such as managing (e.g., downloading, uploading, changing, synchronizing) content on device 1200. Additionally, a docking connector can allow device 1200 to connect to certain peripherals that allow device 1200 to control content output, for example, to audiovisual or other systems.

In addition to a proprietary docking connector or other proprietary connection hardware, device 1200 can make peripheral connections 1280 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, the memory subsystem 1120 enable a programmable data pattern for multiple writes to memory in accordance with embodiments described above. Thus, in accordance with embodiments, a programmable data pattern for multiple writes to memory can enable efficient writing of a pattern to multiple locations in memory.

Some embodiments of the disclosure follow. In one embodiment, a memory device includes input/output (I/O) circuitry to receive a command, a register to store a value to indicate a source of a data pattern to write in response to receipt of the command, and access circuitry to, in response to receipt of the command, write the data pattern to memory based on the source indicated by the value in the register. In one embodiment, the register is to indicate one of multiple data pattern sources, including a source of a data pattern that is all zeros. In one embodiment, the multiple data pattern sources further include a source of a data pattern that is all ones. In one embodiment, the multiple data pattern sources further include data latches of the memory device to store a data pattern latched from a prior command. In one embodiment, the access circuitry is to write the data pattern to memory without receipt of the data pattern over a data bus for the write.

In one embodiment, the I/O circuitry is to receive a first command to write the data pattern once prior to receipt of the command. The memory device includes a data latch to latch the data pattern in response to receipt of the first command, and in response to receipt of the command, the access circuitry is to write the data pattern latched by the data latch from the first command. In one embodiment, the register is to indicate one of multiple data pattern sources, the access circuitry includes a multiplexer to select one of the multiple data pattern sources. In one embodiment, the multiplexer includes an input tied to ground, an input coupled with a voltage source, and an input coupled with a data signal line. In one embodiment, a select input to the multiplexer is based on the value in the register, and in response to the value in the register indicating that a pattern of all zeros is to be written, the multiplexer is to output a '0' based on selection of the input tied to ground. In one embodiment, in response to a value in the register indicating that a pattern of all ones is to be written, the multiplexer is to output a '1' based on selection of the input coupled with the voltage source. In one embodiment, in response to a value in the register indicating that a latched data pattern is to be written, the multiplexer is to output a '0' or '1' based on selection of the input coupled with the data signal line.

In one embodiment, the I/O circuitry is to not receive address information associated with the command, and the access circuitry is to compute an address to write the data pattern to based on previously received address information associated with a previously received command. In one such embodiment, the access circuitry includes a counter circuit to determine a column address to write the data pattern to based on a previously received column address associated with the previously received command.

In one embodiment, a memory controller includes command circuitry to generate a command to cause a data pattern to be written to memory, wherein a source of the data pattern to be written is based on a register, and generate a command to program the register to indicate the source of the data pattern to be written in response to receipt of the command. The memory controller also includes input/output (I/O) circuitry to transmit the command to program the register, and transmit the command to cause the data pattern to be written. In one embodiment, the command circuitry is to program the register to indicate which of multiple data pattern sources is to be written, including a source of a data pattern that is all zeros. In one embodiment, the multiple data pattern sources further include a source of a pattern that is all ones. In one embodiment, the multiple data pattern sources further include data latches of the memory device to store a data pattern latched from a prior command. In one embodiment, the I/O circuitry is to transmit the command to cause the data pattern to be written to memory without transmission of the data pattern over a data bus. In one embodiment, prior to transmission of the command to cause the data pattern to be written to memory, the I/O circuitry is to transmit a first command to write the data pattern once.

In one embodiment, a system includes a processor and a memory device communicatively coupled with the processor, wherein the memory device is in accordance with any embodiment herein. In one embodiment, the system further includes a memory controller communicatively coupled with the processor, wherein the memory controller is in accordance with any embodiment described herein. In one embodiment, the system further includes any of a display communicatively coupled to the processor, a network interface communicatively coupled to the processor, or a battery coupled to provide power to the system.

In one embodiment, a memory device includes means to receive a command, means to store a value to indicate a source of a data pattern to write in response to receipt of the command, and means to, in response to receipt of the command, write the data pattern to memory based on the data pattern indicated by the value in the register. In one embodiment, the means to store the value is to indicate one of multiple data pattern sources, including a source of a data pattern that is all zeros. In one such embodiment, the multiple data pattern sources further include a source of a pattern that is all ones. In one embodiment, the multiple data pattern sources further include data latches of the memory device to store a data pattern latched from a prior command. In one embodiment, the means to write the data pattern to memory is to write the data pattern to memory without receipt of the data pattern over a data bus for the write. In one embodiment, the means to receive the command is to receive a first command to write the data pattern once prior to receipt of the command, wherein the memory device includes a data latch to latch the data pattern in response to receipt of the first command, and wherein in response to receipt of the command, the means to write the data pattern is to write the data pattern latched by the latch in response to receipt of the first command.

In one embodiment, the means to store the value is to indicate one of multiple data pattern sources, wherein the means to write the data pattern includes a multiplexer to select one of the multiple data pattern sources. In one embodiment, the means to receive the command is to not receive address information associated with the command, and means to compute an address to write the data pattern to based on previously received address information associated with a previously received command. In one such embodiment, the means to compute the address includes a counter circuit to determine a column address to write the data pattern to based on a previously received column address associated with the previously received command.

In one embodiment, a method includes receiving a command, storing a value in a hardware register to indicate a source of a data pattern to write in response to receipt of the command, and in response to receipt of the command, writing the data pattern to memory based on the source indicated by the value in the register. In one embodiment, the register is to indicate one of multiple data pattern sources, including a source of a data pattern that is all zeros. In one embodiment, the multiple data pattern sources further include a source of a data pattern that is all ones. In one embodiment, the multiple data pattern sources further include data latches of the memory device to store a data pattern latched from a prior command. In one embodiment, the method further involves receiving a first command to write the data pattern once prior to receipt of the command, latching the data pattern in a data latch in response to receipt of the first command, and in response to receipt of the command, writing the data pattern latched by the data latch from the first command. In one embodiment, in response to the value in the register indicating that a pattern of all zeros is to be written, writing zeros based on selection of a multiplexer input tied to ground. In one embodiment, in response to a value in the register indicating that a pattern of all ones is to be written, writing ones based on selection of a multiplexer input coupled with a voltage source. In one embodiment, in response to a value in the register indicating that a latched data pattern is to be written, writing the latched data pattern based on selection of a multiplexer input coupled with a data signal line. In one embodiment, the method further involves computing an address to write the data pattern to based on previously received address information associated with a previously received command.

In one embodiment, a method involves generating a command to cause a data pattern to be written to memory, wherein a source of the data pattern to be written is based on a register, generating a command to program the register to indicate the source of the data pattern to be written in response to receipt of the command, transmitting the command to program the register, and transmitting the command to cause the data pattern to be written. In one embodiment, the register is to indicate one of multiple data pattern sources, including a source of a pattern that is all zeros, all ones or data latches of the memory device to store a data pattern latched from a prior command. In one embodiment, the method involves not transmitting the data pattern over a data bus with the command to cause the data pattern to be written. In one embodiment, the method further involves prior to transmission of the command to cause the data pattern to be written to memory, transmitting a first command to write the data pattern once.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:
   input/output (I/O) circuitry to:
   receive, from a memory controller, a first command to write a data pattern, and receive a second command;
   a register to store a value to indicate a source of data to write in response to receipt of the second command; and
   access circuitry to, in response to receipt of the second command, write the data pattern latched from the first command to memory based on the value in the register indicating the source is data signal lines of the memory device, the data signal lines to couple with a data bus between the memory device and the memory controller.

2. The memory device of claim 1, wherein the register is to indicate one of multiple data pattern sources, including a source of a data pattern that is all zeros.

3. The memory device of claim 2, wherein the multiple data pattern sources further include a source of a data pattern that is all ones.

4. The memory device of claim 1, wherein:
the access circuitry is to write the data pattern to memory without receipt of the data pattern over the data bus for the second command.

5. The memory device of claim 1, wherein:
wherein the memory device comprises a data latch to latch the data pattern in response to receipt of the first command; and
wherein in response to receipt of the second command, the access circuitry is to write the data pattern latched by the data latch from the first command.

6. The memory device of claim 1, wherein:
the register is to indicate one of multiple data pattern sources; and
wherein the access circuitry includes a multiplexer to select one of the multiple data pattern sources.

7. The memory device of claim 6, wherein:
the multiplexer includes: an input tied to ground, an input coupled with a voltage source, and an input coupled with one of the data signal lines.

8. The memory device of claim 7, wherein:
a select input to the multiplexer is based on the value in the register; and
wherein, in response to the value in the register indicating that a pattern of all zeros is to be written, the multiplexer is to output a '0' based on selection of the input tied to ground.

9. The memory device of claim 7, wherein:
a select input to the multiplexer is based on the register; and
wherein, in response to a value in the register indicating that a pattern of all ones is to be written, the multiplexer is to output a '1' based on selection of the input coupled with the voltage source.

10. The memory device of claim 7, wherein:
a select input to the multiplexer is based on the register; and
wherein, in response to the value in the register indicating the source is data signal lines of the memory device, the multiplexer is to output a '0' or '1' based on selection of the input coupled with one of the data signal lines.

11. The memory device of claim 1, wherein:
the I/O circuitry is to receive the second command without associated address information; and
wherein the access circuitry is to compute an address to write the data pattern to based on address information associated with the first command.

12. The memory device of claim 11, wherein: the access circuitry comprises a counter circuit to determine a column address to write the data pattern to based on a column address associated with the first command.

13. A memory controller comprising:
command circuitry to:
generate a first command to write a data pattern to a memory device;
generate a second command, wherein a source of data to be written in response to the second command is based on a register, and
generate a third command to program the register to indicate the source of the data to be written in response to receipt of the second command; and
input/output (I/O) circuitry to:
transmit the third command to the memory device to program the register,
transmit the first command to write the data pattern; and
transmit the second command to cause the data pattern from the first command to be written based on a value in the register indicating the source is data signal lines of the memory device, the data signal lines to couple with a data bus between the memory device and the memory controller.

14. The memory controller of claim 13, wherein the command circuitry is to program the register to indicate which of multiple data pattern sources is to be written, including a source of a data pattern that is all zeros.

15. The memory controller of claim 14, wherein the multiple data pattern sources further include a source of a pattern that is all ones.

16. The memory controller of claim 14, wherein the multiple data pattern sources further include data signal lines of the memory device.

17. The memory controller of claim 13, wherein:
the I/O circuitry is to transmit the second command without transmission of the data pattern over the data bus for the second command.

18. A system comprising:
a processor; and
a memory device communicatively coupled with the processor, the memory device comprises:
input/output (I/O) circuitry to:
receive, from a memory controller, a first command to write a data pattern, and
receive a second command;
a register to store a value to indicate a source of data to write in response to receipt of the second command; and
access circuitry to, in response to receipt of the second command, write the data pattern latched from the first command to memory based on the value in the register indicating the source is data signal lines of the memory device, the data signal lines to couple with a data bus between the memory device and the memory controller.

19. The system of claim 18, further comprising:
a memory controller communicatively coupled with the processor, wherein the memory controller comprises:
command circuitry to:
generate the first command to write the data pattern to the memory device;
generate the second command, and
generate a third command to program the register to indicate the source of data to be written in response to receipt of the second command; and
input/output (I/O) circuitry to:
transmit the third command to the memory device to program the register,
transmit the first command to write the data pattern, and
transmit the second command to cause the data pattern from the first command to be written to the memory device based on the value in the register indicating the source is data signal lines of the memory device, the data signal lines to couple with a data bus between the memory device and the memory controller.

20. The system of claim 18, further comprising:
any of a display communicatively coupled to the processor, a network interface communicatively coupled to the processor, or a battery coupled to provide power to the system.

21. A method comprising:
receiving, from a memory controller, a first command to write a data pattern to a memory device;
receiving a second command;
storing a value in a hardware register to indicate a source of data to write in response to receipt of the second command; and
in response to receipt of the second command, writing the data pattern latched from the first command to memory based on the value in the hardware register indicating the source is data signal lines of the memory device, the data signal lines to couple with a data bus between the memory device and the memory controller.

22. The method claim 21, wherein the hardware register is to indicate one of multiple data pattern sources, including a source of a data pattern that is all zeros.

23. The method of claim 22, wherein the multiple data pattern sources further include a source of a data pattern that is all ones.

24. The method of claim 22, wherein the multiple data pattern sources further include data latches of the memory device to store a data pattern latched from a prior command.

25. The method of claim 21, further comprising:
latching the data pattern in a data latch in response to receipt of the first command; and
in response to receipt of the second command, writing the data pattern latched by the data latch from the first command.

26. The method of claim 21, wherein:
in response to the value in the hardware register indicating a source of a data pattern that is all zeros, writing zeros based on selection of a multiplexer input tied to ground.

27. The method of claim 21, wherein:
in response to a value in the hardware register indicating a source of a data pattern that is all ones, writing ones based on selection of a multiplexer input coupled with a voltage source.

28. The method of claim 21, wherein:
in response to a value in the hardware register indicating that the source is data signal lines of the memory device, writing the data pattern based on selection of a multiplexer input coupled with one of the data signal lines.

* * * * *